(12) United States Patent
Podell et al.

(10) Patent No.: US 10,217,567 B2
(45) Date of Patent: Feb. 26, 2019

(54) MULTILAYER CAPACITORS

(71) Applicant: Werlatone, Inc., Brewster, NY (US)

(72) Inventors: Allen F. Podell, Palo Alto, CA (US); Ky-Hien Do, Mississauga (CA)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 15/833,767

(22) Filed: Dec. 6, 2017

(65) Prior Publication Data

US 2018/0158615 A1 Jun. 7, 2018

Related U.S. Application Data

(60) Provisional application No. 62/430,793, filed on Dec. 6, 2016.

(51) Int. Cl.

| | |
|---|---|
| *H01G 4/30* | (2006.01) |
| *H01G 4/232* | (2006.01) |
| *H01G 4/12* | (2006.01) |
| *H01G 4/012* | (2006.01) |
| *H01G 4/38* | (2006.01) |
| *H01G 4/40* | (2006.01) |
| *H01G 2/06* | (2006.01) |
| *H01G 4/228* | (2006.01) |
| *H05K 1/18* | (2006.01) |

(52) U.S. Cl.
CPC ............ *H01G 4/30* (2013.01); *H01G 2/06* (2013.01); *H01G 4/012* (2013.01); *H01G 4/12* (2013.01); *H01G 4/228* (2013.01); *H01G 4/232* (2013.01); *H01G 4/38* (2013.01); *H01G 4/40* (2013.01); *H05K 1/181* (2013.01)

(58) Field of Classification Search
None
See application file for complete search history.

(56) References Cited

U.S. PATENT DOCUMENTS

| 4,517,155 A | 5/1985 | Prakash et al. |
|---|---|---|
| 5,636,099 A | 6/1997 | Sugawara et al. |
| 6,266,229 B1 | 7/2001 | Naito et al. |

(Continued)

OTHER PUBLICATIONS

European Patent Office, Extended European Search Report for European Patent Application No. 17205642.6, dated Apr. 24, 2018, 9 pages.

*Primary Examiner* — Dion Ferguson
(74) *Attorney, Agent, or Firm* — Kolisch Hartwell, P.C.

(57) ABSTRACT

A multilayer capacitor may include a capacitor stack having pluralities of first and second plate electrodes connected to respective stack face terminals. Two face terminals on different stack sides are connected to the first plate electrodes. Two different face terminals also on different stack sides are connected to the second plate electrodes. Respective base conductors connect to the two sets of face terminals for connecting the capacitor to an external circuit. Three face terminals may be connected to the first or second plate electrodes. The base conductors may connect to the face terminals at the same relative position of the capacitor stack, at different relative positions of the capacitor stack. A capacitor stack may be positioned with a stack end facing a base substrate. Two multilayer capacitors may be mounted electrically in parallel with one or more lossy elements spanning a gap between the capacitors.

19 Claims, 21 Drawing Sheets

(56) References Cited

U.S. PATENT DOCUMENTS

| | | | |
|---|---|---|---|
| 6,327,134 B1 | 12/2001 | Kuroda et al. | |
| 2003/0007310 A1* | 1/2003 | Trinh | H01G 4/30 |
| | | | 361/302 |
| 2003/0161089 A1* | 8/2003 | Togashi | H01G 4/232 |
| | | | 361/306.1 |
| 2005/0200436 A1 | 9/2005 | Lee et al. | |
| 2006/0279903 A1* | 12/2006 | Togashi | H01G 4/232 |
| | | | 361/303 |
| 2007/0057755 A1 | 3/2007 | Suzuki et al. | |
| 2009/0015982 A1* | 1/2009 | Togashi | H01G 4/232 |
| | | | 361/302 |
| 2009/0147489 A1* | 6/2009 | Togashi | H01G 2/065 |
| | | | 361/777 |
| 2010/0188799 A1 | 7/2010 | Galvagni et al. | |
| 2015/0014035 A1 | 1/2015 | Park et al. | |
| 2016/0042869 A1 | 2/2016 | Park et al. | |
| 2016/0113116 A1 | 4/2016 | Kay | |

* cited by examiner

MULTILAYER CAPACITORS

RELATED APPLICATIONS

This application claims the benefit of U.S. Provisional Application No. 62/430,793, filed Dec. 6, 2016, which application is incorporated herein by reference in its entirety for all purposes.

INTRODUCTION

Capacitors are used in electrical circuits to add capacitance. Capacitance is useful for storing electrical charge at direct current voltages and for filtering and balancing inductance in high frequency applications. Multilayer capacitors having alternating layers of plate electrodes results in the parallel connection of multiple capacitors connected in parallel. This configuration increases capacitance and decreases losses and parasitic inductances in high frequency circuits.

FIG. 1 is an illustration of an exemplary process 30 for making multilayer ceramic capacitors. A multilayer ceramic capacitor is in effect a number of individual capacitors stacked together in parallel and contacted via terminal surfaces. In this example, the starting material is a mixture of finely ground granules of paraelectric or ferroelectric raw materials, modified by additives. These powdered materials are mixed homogeneously provided during powder milling in a step 31.

A thin ceramic foil is cast in a step 32 from a suspension of the powder with a suitable binder. This foil is rolled up for transport. Unrolled again, it is cut into equal-sized sheets, which are screen printed with a metal paste during inner electrode printing in a step 33. These sheets become the electrodes. In an automated process, these sheets are stacked in the required number of layers in a step 34 and solidified by pressure during lamination step 35. Besides the relative permittivity, the size and number of layers determines the later capacitance value. The electrodes are stacked in an alternating arrangement slightly offset from the adjacent layers so that they each can later be connected on the offset side, one left, and one right. The layered stack is pressed and then cut during step 36 into individual components.

After cutting, the binder is burned out of the stack in a step 37. This is followed by sintering in a step 38, producing the final, mainly crystalline structure. This burning process creates the desired dielectric properties. Burning is followed by cleaning and tumbling in a step 39 and then metallization of both end surfaces in a step 40. Through the metallization during termination plating in a step 41, the ends and the inner electrodes are connected in parallel and the capacitor gets its terminals. Finally, the electrical values of the capacitors are measured in a testing and inspection step 42 and the capacitors are mounted on tape in a final step 43 for automated processing in a manufacturing device.

FIG. 2 is an isometric view of a representative basic multilayer capacitor 50. A stack 51 of capacitor plate electrodes 52 are mounted on a microstrip substrate, for example, with base conductors 53, 54 on respective opposite stack side faces 56 and 59. Capacitor plate electrodes 52 include uniformly sized and shaped rectangular first plate electrodes 55 and second plate electrodes 56. For ease of illustration, the plate electrodes are illustrated with a single line to represent the thinness of the plate electrodes, but it will be appreciated that the plate electrodes have a thickness. Base conductor 53 is connected to a face terminal 57 covering a stack side face 61. Face terminal 57 is connected to first plate electrodes 55. Base conductor 54 is connected to a face terminal 58 covering a stack side face 59 on an opposite side face of capacitor stack 51 from stack side face 61. Face terminal 58 is connected to second plate electrodes 56. Plate electrodes 55 and 56 are positioned alternatingly in parallel separated by a dielectric material 60, such as ceramic, filling what is shown as empty space in the illustration.

In general terms, a typical multilayer capacitor may be considered to be constructed as a long strip of thin top-and-bottom metallized dielectric that is folded back and forth on itself to form the layered structure. Metal terminals are added on the folded ends, connecting the alternate metal layers. The resulting structure is a small, monolithic, interdigitated multilayer chip capacitor, such as the one shown in FIG. 2.

FIG. 2 shows both vertical face terminals connected to the microstrip at the bottom of the face terminal in the microstrip plane. In another example, one of the face terminals is connected to the microstrip at the top of the face terminal.

SUMMARY

The present disclosure provides various embodiments of multilayer capacitors. In some embodiments, a multilayer capacitor comprises physically and electrically spaced-apart coplanar first and second base conductors, face terminals, and a capacitor stack. Each of the first and second base conductors may be configured to be electrically connected to respective different first and second external conductors of an external circuit. The capacitor stack has a plurality of first plate electrodes, a plurality of second plate electrodes, and a first dielectric body supporting the first and second plate electrodes in spaced apart positions. The capacitor stack has a plurality of stack side faces transverse to planes of the first and second plate electrodes. The capacitor stack is supported relative to the first and second base conductors with one of the first plurality of stack side faces facing and extending along a plane containing the first and second base conductors. A first face terminal extends along any one of the first plurality of stack side faces in contact with the first plate electrodes and is electrically connected to the first base conductor. A second face terminal is electrically spaced from the first face terminal, extends along any one of the first plurality of stack side faces in contact with the plurality of second plate electrodes, and is electrically connected to the second base conductor.

In some embodiments, a capacitor assembly comprises first and second multilayer capacitors and a lossy component. The first multilayer capacitor comprises physically and electrically spaced-apart coplanar first and second base conductors and a first capacitor stack. Each of the first and second base conductors is configured to be electrically connected to respective different first and second external conductors of an external circuit. The first capacitor stack has a plurality of first plate electrodes, a plurality of second plate electrodes, and a first dielectric body supporting the first and second plate electrodes in spaced apart parallel positions. The first capacitor stack has a first plurality of stack side faces transverse to planes of the first and second plate electrodes. A first face terminal extends along any one of the first plurality of stack side faces in contact with the first plate electrodes and is electrically connected to the first base conductor. A second face terminal is electrically spaced from the first face terminal, extends along any one of the first plurality of stack side faces in contact with the plurality of second plate electrodes, and is electrically connected to the second base conductor.

The second multilayer capacitor is supported electrically in parallel and physically spaced apart in a side-by-side configuration with the first multilayer capacitor. The second multilayer capacitor includes physically and electrically spaced-apart coplanar third and fourth base conductors and a capacitor stack. The third base conductor is configured to be electrically connected to the first external conductor. The fourth base conductor is configured to be electrically connected to the second external conductor. The second capacitor stack has a plurality of third plate electrodes, a plurality of fourth plate electrodes, and a second dielectric body supporting the third and fourth plate electrodes in spaced apart parallel positions. The second capacitor stack has a second plurality of stack side faces transverse to planes of the third and fourth plate electrodes. A third face terminal extends along any one of the second plurality of stack side faces in contact with the third plate electrodes and is electrically connected to the third base conductor. A fourth face terminal is electrically spaced from the third face terminal, extends along any one of the plurality of stack side faces in contact with the plurality of fourth plate electrodes, and is electrically connected to the fourth base conductor. The lossy component extends between the first and third base conductors, and is at least one of magnetically lossy and electrically lossy.

In some embodiments, a multilayer capacitor comprises physically and electrically spaced-apart first and second base conductors, a capacitor stack, and a plurality of face terminals. Each of the first and second base conductors is configured to be attached to a respective different external conductor of an external circuit. The capacitor stack has a plurality of first plate electrodes, a plurality of second plate electrodes, and a dielectric body supporting the first and second plate electrodes in spaced-apart positions. The capacitor stack has two stack end faces and four stack side faces including two pairs of oppositely positioned stack side faces. The two stack end faces extend between respective edges of the four stack side faces. The first and second plate electrodes of the respective pluralities of first and second plate electrodes extend in planes transverse to the four stack side faces. Each of the first plate electrodes extends to at least two of the stack side faces, and each of the second plate electrodes extend to at least two of the stack side faces.

A first face terminal extends along one of the two stack side faces to which the first plate electrodes extend. The first face terminal is in contact with the first plate electrodes. A second face terminal extends along the other of the two stack side faces to which the first plate electrodes extend. The second face terminal is in contact with the first plate electrodes. A third face terminal extends along one of the two stack side faces to which the second plate electrodes extend. The third face terminal is in contact with the second plate electrodes. A fourth face terminal extends along the other of the two stack side faces to which the second plate electrodes extend. The second face terminal is in contact with the second plate electrodes. The first and second face terminals are electrically connected to the first base conductor and the third and fourth face terminals are electrically connected to the second base conductor.

Features, functions, and advantages may be achieved independently in various embodiments of the present disclosure, or may be combined in yet other embodiments, further details of which can be seen with reference to the following description and drawings.

DESCRIPTION

Various embodiments of a multilayer capacitor having interdigital layers, are described below and illustrated in the associated drawings. Unless otherwise specified, a multilayer capacitor and/or its various components may, but are not required to, contain at least one of the structure, components, functionality, and/or variations described, illustrated, and/or incorporated herein. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Figure 3:
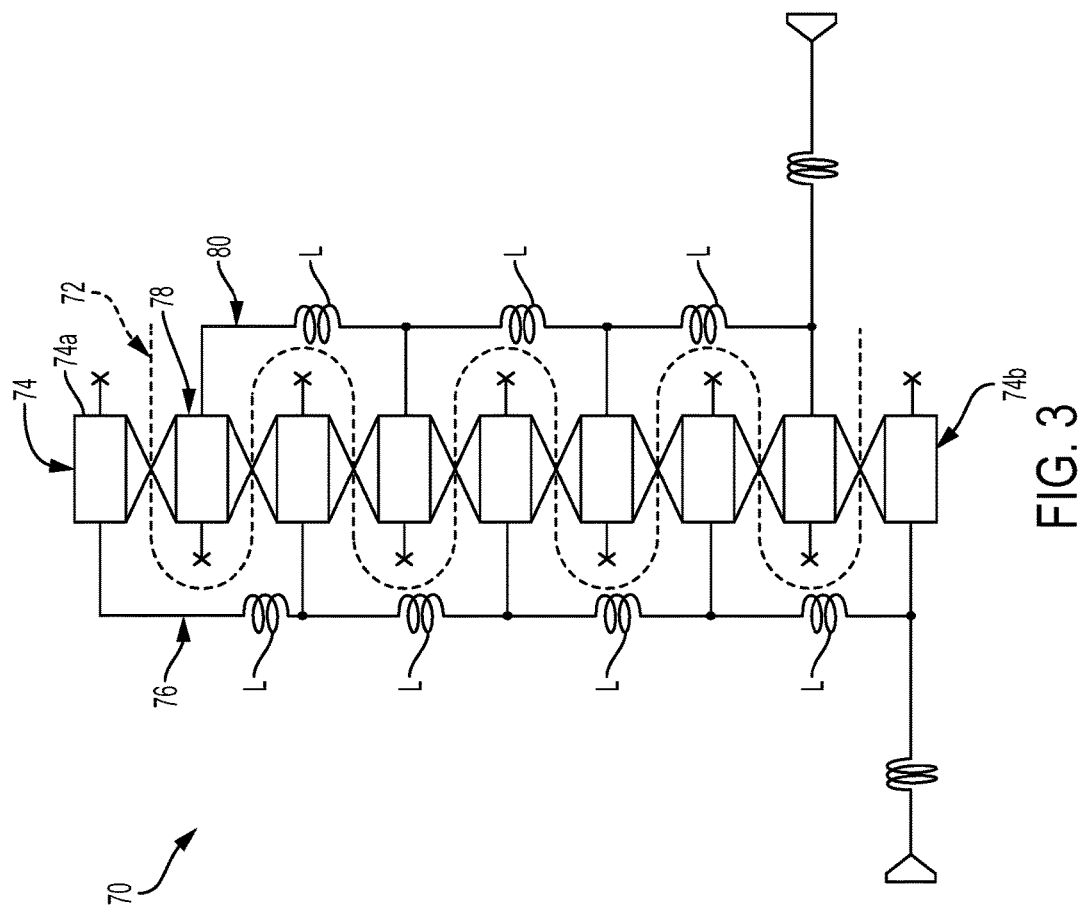
FIG. 3 is an exemplary equivalent circuit of a multilayer capacitor.

FIG. 3 is an exemplary equivalent circuit of a multilayer capacitor 70 showing that the structure can also be considered a long transmission line 72, represented by a dashed line, snaking between the capacitor layers formed by alternating first plate electrodes 74 connected to a face terminal 76 and second plate electrodes 78 connected to a face terminal 80. The capacitor-stack face terminals form conductive caps between alternate capacitor layers of plate electrodes. The opposing face terminals close in transmission line 72 extending between an end first plate electrode 74a opposite a second end plate electrode. The second end plate electrode is shown as a first plate electrode 74b, but it could also be an end plate of second plate electrodes 78. The face terminals 76, 80 provide distributed inductance represented by inductors L. Due to its transmission line nature, this capacitor has a high frequency open circuit resonance that degrades its broadband performance. This resonance is referred to herein as the SRF (self-resonant frequency.)

An additional problem is that skin effect results in increased ESR (effective series resistance), as the parallel currents in the metal layers behave very much like those in a thick current-carrying-conductor. This effect is reduced by dividing the capacitor into two or more chips that are spaced apart enough to reduce the interaction of the parallel current paths as is illustrated by the capacitor shown in FIG. 4.

Figure 4:
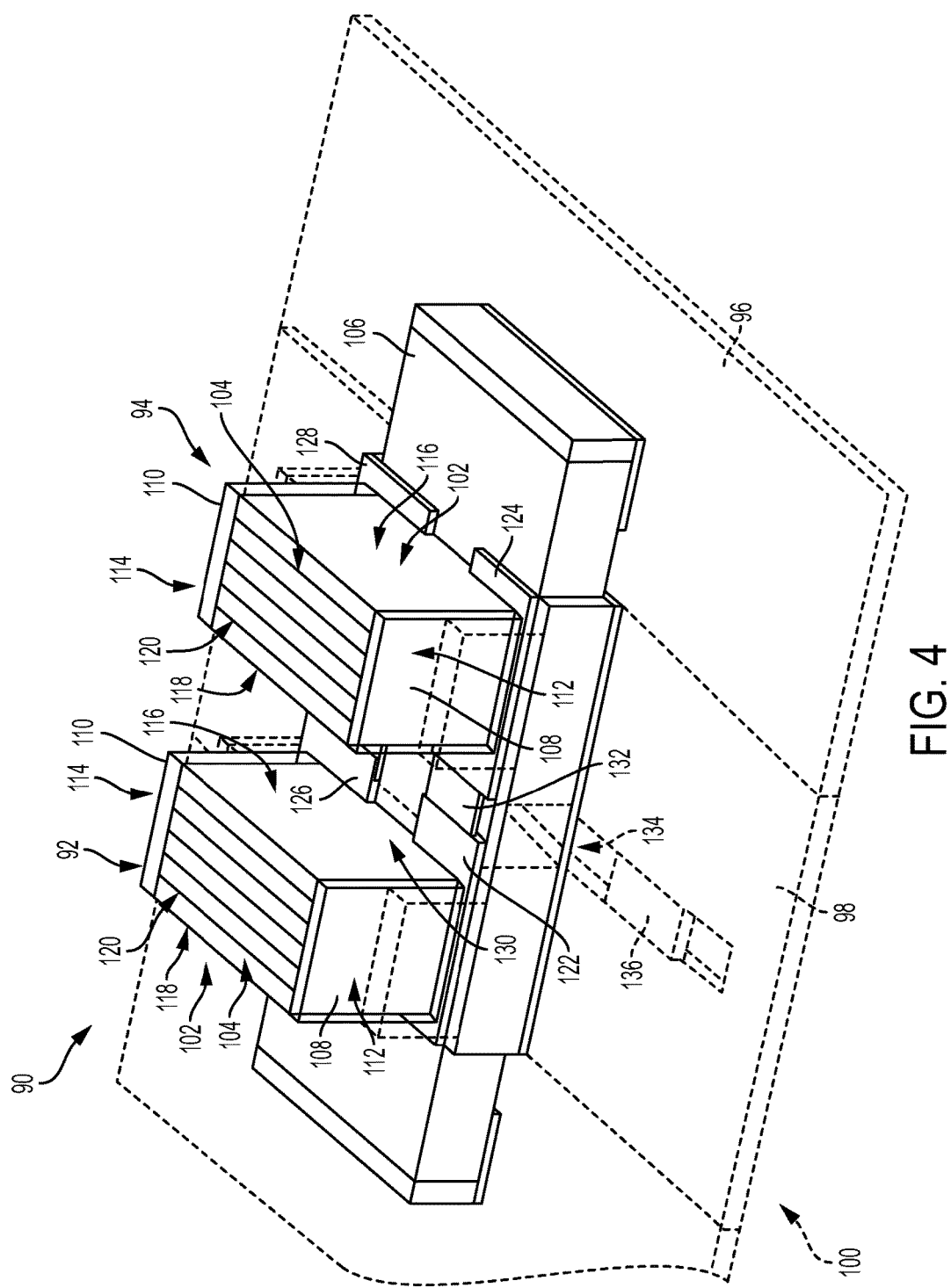
FIG. 4 illustrates a simplified isometric view of an example of a capacitor assembly including two multilayer capacitors mounted in parallel on edge on a substrate having a signal line of a microstrip transmission line.
Figure 5:
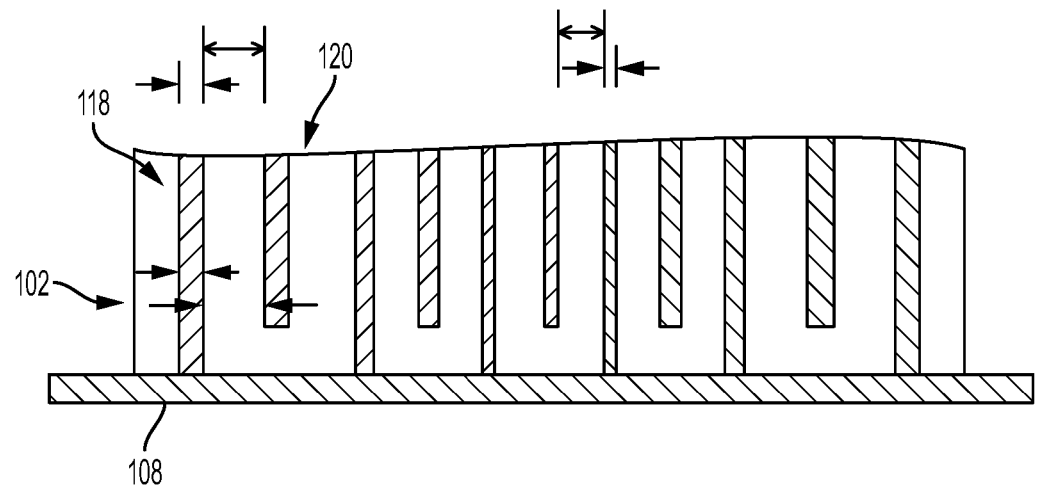
FIG. 5 is a partial cross-section illustrating an exemplary configuration of one side of an exemplary capacitor stack, such as the capacitor stack of FIG. 2 or one or both of the capacitor stacks illustrated in FIG. 4.
Figure 6:
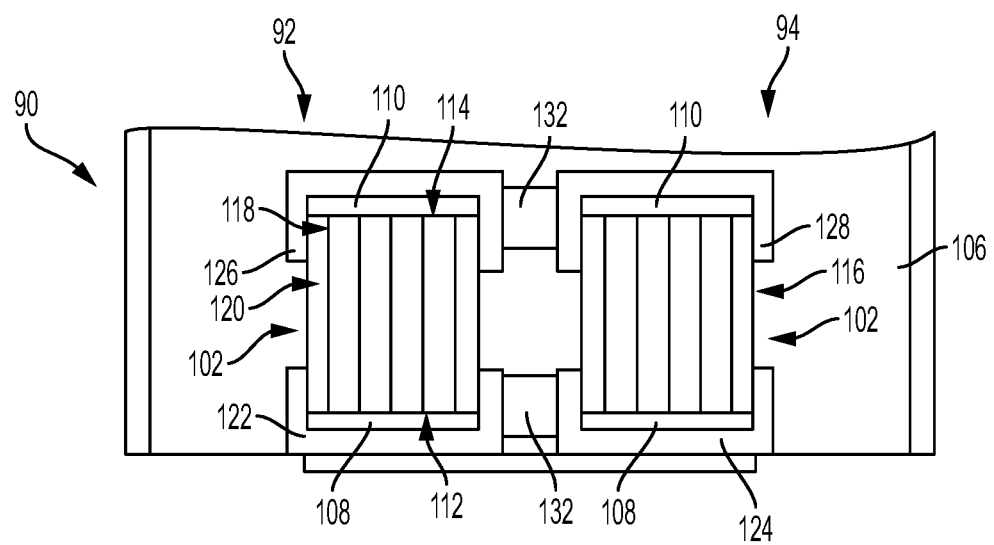
FIG. 6 is a top view of the capacitor assembly of FIG. 4.

FIGS. 4-6 illustrate a capacitor assembly 90 including two multilayer capacitors 92, 94 mounted in parallel on edge on a substrate 96 having a signal line 98 of a microstrip transmission line 100. FIG. 4 is a simplified isometric view of capacitor assembly 90, FIG. 5 is a partial cross section illustrating an exemplary configuration of plate electrodes that may be used in forming capacitor 92 and/or 94, and FIG. 6 is a top view of capacitor assembly 90. Capacitor assembly 90 straddles a gap (not shown) in signal line 98. Capacitors 92, 94 each include a capacitor stack 102 of capacitor plate electrodes 104 mounted on a base dielectric substrate 106, for example, with face terminals 108, 110 on respective opposite stack side faces 112 and 114. A stack side face is transverse (normal in this example) to the edges of the plate electrodes. A stack end face, such as end face 116, extends along (parallel to in this example) an end plate electrode. Capacitor plate electrodes 104 include first plate electrodes 118 and second plate electrodes 120.

Face terminal 108 of capacitor 92 is connected to a base conductor 122 supported on substrate 106 and to first plate electrodes 118. Similarly, face terminal 108 of capacitor 94 is connected to a base conductor 124 also supported on substrate 106 and to respective first plate electrodes 118. Face terminal 110 of capacitor 92 is connected to a base conductor 126 supported on substrate 106 and to second plate electrodes 120. Similarly, face terminal 110 of capacitor 94 is connected to a base conductor 128 also supported on substrate 106 and to respective second plate electrodes 120.

The dual-chip capacitor assembly 90 may be formed of two separate capacitors 92, 94 of half the capacitance of a corresponding single-chip capacitor and 1.4 times the SRF of a single chip capacitor. The two separate capacitors can be slightly spaced and paralleled, as shown in FIG. 4, resulting in half the ESR of the individual parts. The physical separation of these capacitors results in their having a small inductance in series with each part before they are paralleled. When those two series LC circuits are connected together, unless they are identical, there is a parallel resonance located in frequency between the two somewhat different series resonant frequencies of the individual capacitors. There is a physical gap 130 between the two capacitors. The current on one side is inductive and on the other side is capacitive. The equal and opposite currents provide a parallel resonance, and a strong magnetic field in the gap.

A thin sheet 132 of lossy magnetic material, such as ferrite or polyiron, quenches the resonance. A material is lossy if it produces more than twice the electrical or inductive loss of a conventional copper conductor of like configuration, and preferably more than 100 times the loss of copper conductor. Lossy sheet 132 may be disposed between base conductors 122 and 124 and/or between base conductors 126 and 128. At other frequencies, where no differential current exists, the ferrite is flanked by capacitors carrying essentially equal currents in the same direction, and little magnetic field will exist between the capacitors. Thus, there is little loss in the ferrite sheet. Simulations show that this resonance problem is not serious unless the capacitors are a considerable distance apart, such as 2 mm.

In many applications a capacitor is used in series with the remaining circuitry. If the single capacitor is replaced by two capacitors mounted side-by-side on a planar transmission line, the line can be sliced down the center, effectively putting the parallel capacitors on either side of a small gap 134, shown in dashed lines. A resistor 136 can be added across gap 134. No current will flow through the resistor unless the current through the capacitors is unequal, and this occurs only at the frequency of the parallel resonance. The resistor will then quench the parallel resonance. For even more resonance damping, another resistor can be placed at the distal end of the capacitors, again straddling a similar gap or slit in the transmission line into which the capacitors have been inserted.

Two techniques have been described above for the elimination of the parallel resonance that typically occurs when two similar capacitors are paralleled. The internal transmission line resonance is substantially reduced by controlling how the currents are fed to the capacitor plate electrodes. For example, mounting the capacitor across the gap on a PC board trace with the capacitor layers of plate electrodes perpendicular to the surface of the PCB, as illustrated in FIG. 4, has better resonance behavior than with the layers of plate electrodes parallel to the surface of the PCB. In this example, a stack side face is mounted on base substrate 106, with the planes of the plate electrodes transverse, such as perpendicular, to base substrate 106 and the underlying PCB represented by substrate 96.

The more the plate electrodes of the capacitor are fed equal currents, then the less the excitation of the end-to-end transmission line, and the greater the increase in the SRF. If the capacitor(s) is embedded in the transmission line, with the connections at the center of the end metallizations, (see FIG. 16 below) the current equalization to the capacitor plate-electrode fingers can be closely approximated, and the SRF pushed higher.

Focusing on the capacitor design for damping the resonances with loss, resistance may be added in the fabrication of the capacitor to interfere with the internal resonances. An open-circuited half-wavelength resonant line has a current maximum at its center. Applying this observation here, making the center plate electrodes of the capacitor with somewhat more loss than the outer plate electrodes makes a better broadband capacitor. Similarly, tapering the thickness of the dielectric layers and/or using thinner layers near the middle also accomplishes the same thing. The resulting capacitor has somewhat lower Q at low frequency, but a lower ESR and loss at high frequencies.

FIG. 5 is a partial cross section of a portion of a capacitor stack 102 illustrating an exemplary configuration of plate electrodes 118 and 120. In this example, the plate electrodes near the center are relatively thin and the plate electrodes are spaced relatively closely together. The thickness of the plate electrodes and the spacing between the plate electrodes increases in increments or progressively towards the ends. Near the ends of face terminal 108, it is seen that the plate electrodes are relatively thicker and the plate electrodes are spaced further apart. This configuration produces a somewhat greater loss in the capacitor in the center region of the capacitor stack than closer to the outer or end regions.

Reduction of skin effect losses is achieved by increasing the surface area of the capacitor. For example, its width may be at least equal to the width of the gap in the metal line it is soldered to. Ideally, then, the capacitor has many layers of plate electrodes in parallel across the gap, and these layers are perpendicular to the PCB. Two or more capacitors in parallel across the gap work also, but is more complicated to assemble. Resonances between the paralleled capacitors are then damped out.

Figure 1:
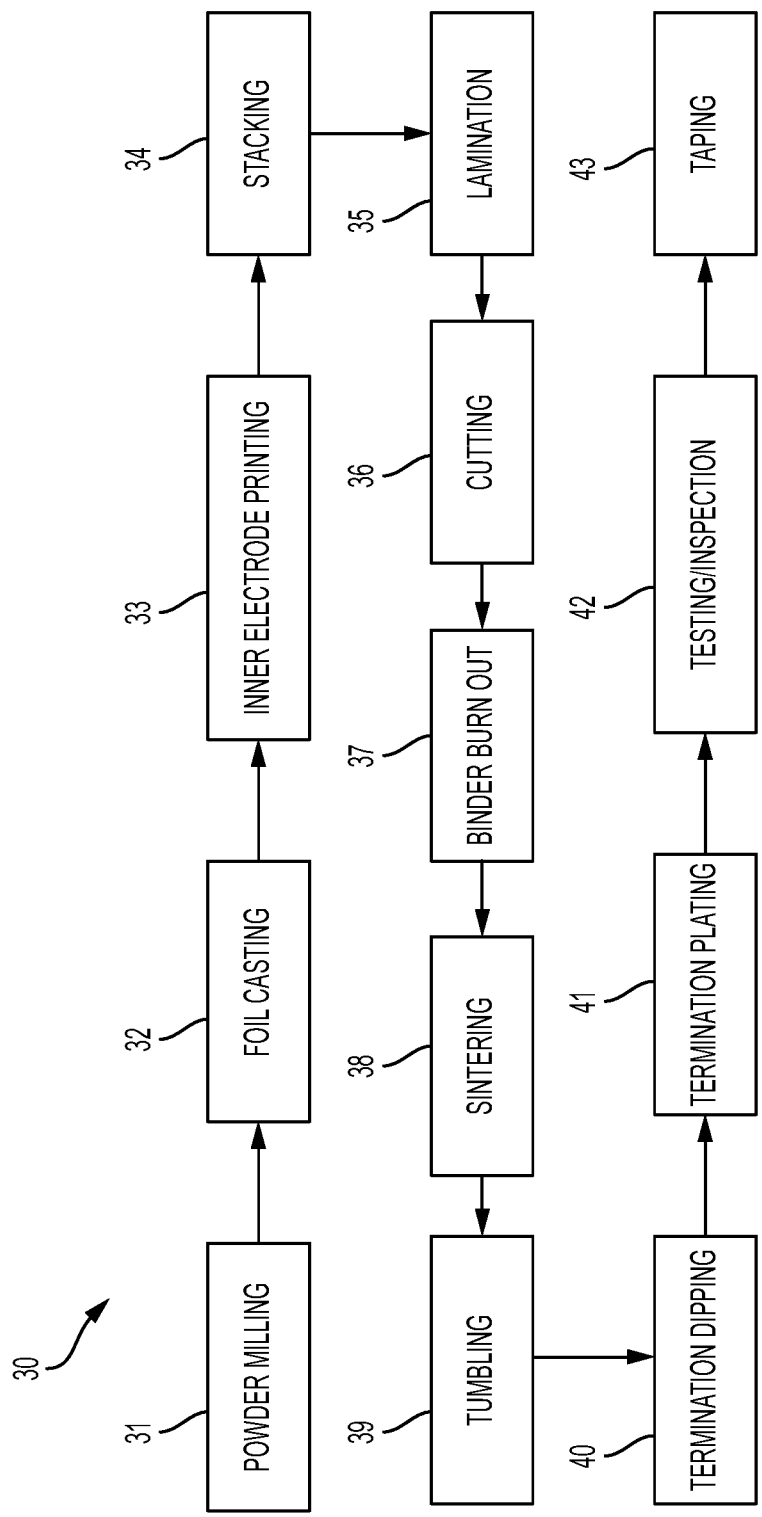
FIG. 1 is an illustration of an exemplary process for making multilayer ceramic capacitors.
Figure 2:
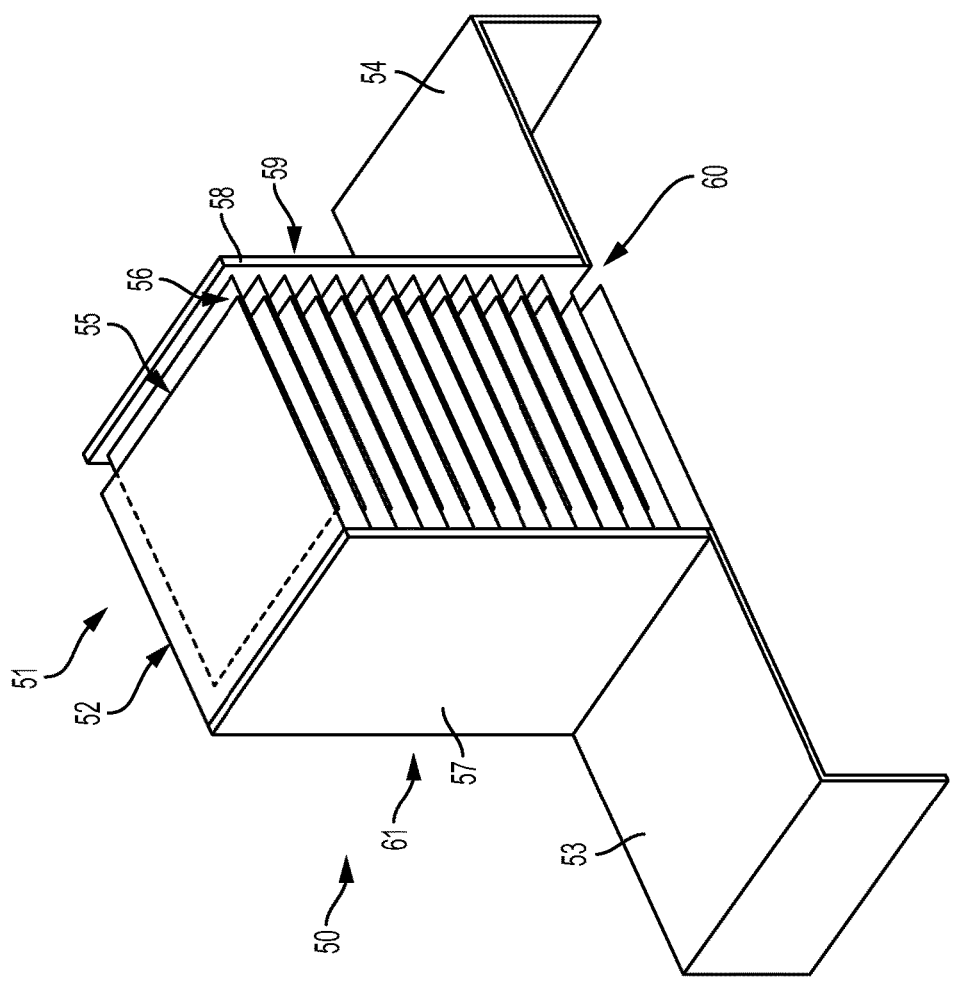
FIG. 2 is an isometric view of a representative basic multilayer capacitor.
Figure 7:
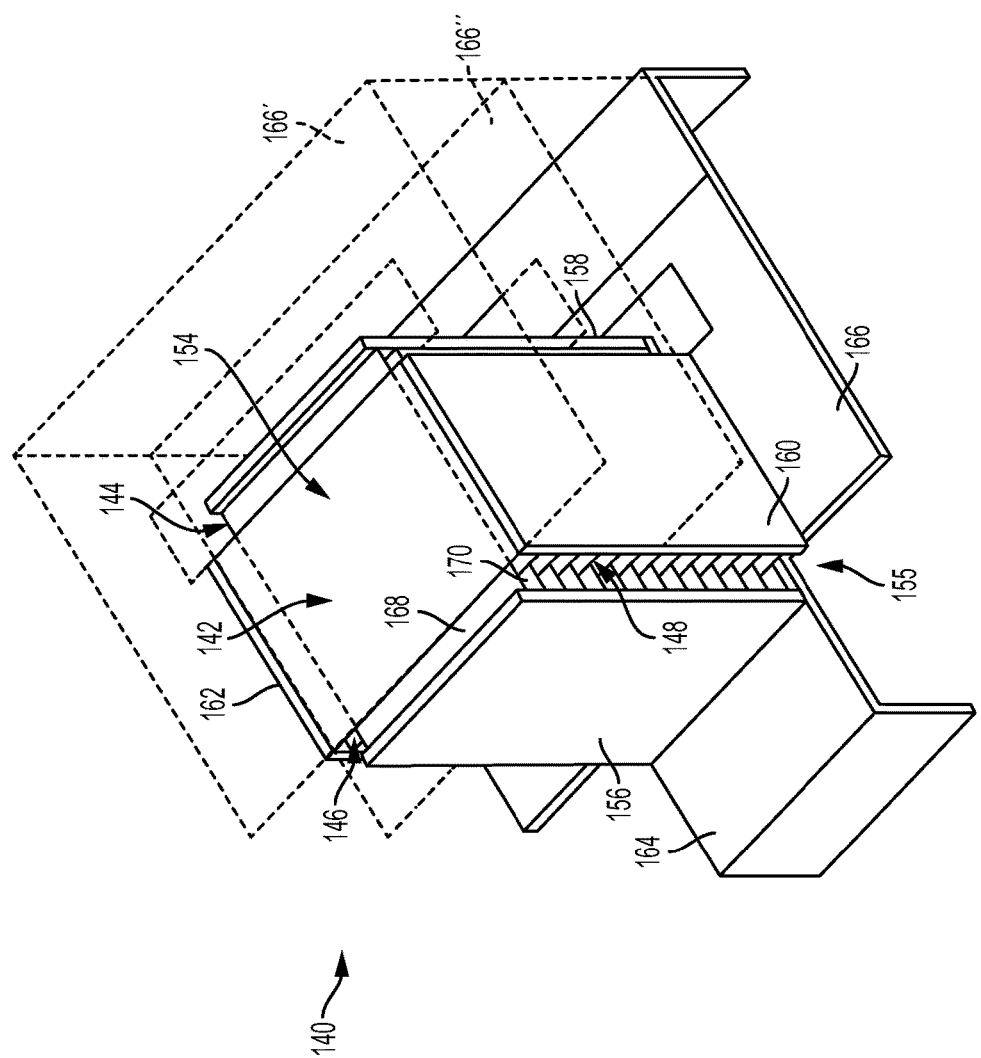
FIG. 7 is an isometric view of an example of a multilayer cross-terminated capacitor having each terminal formed of face terminals at opposite sides of each series of plate electrodes.
Figure 8:
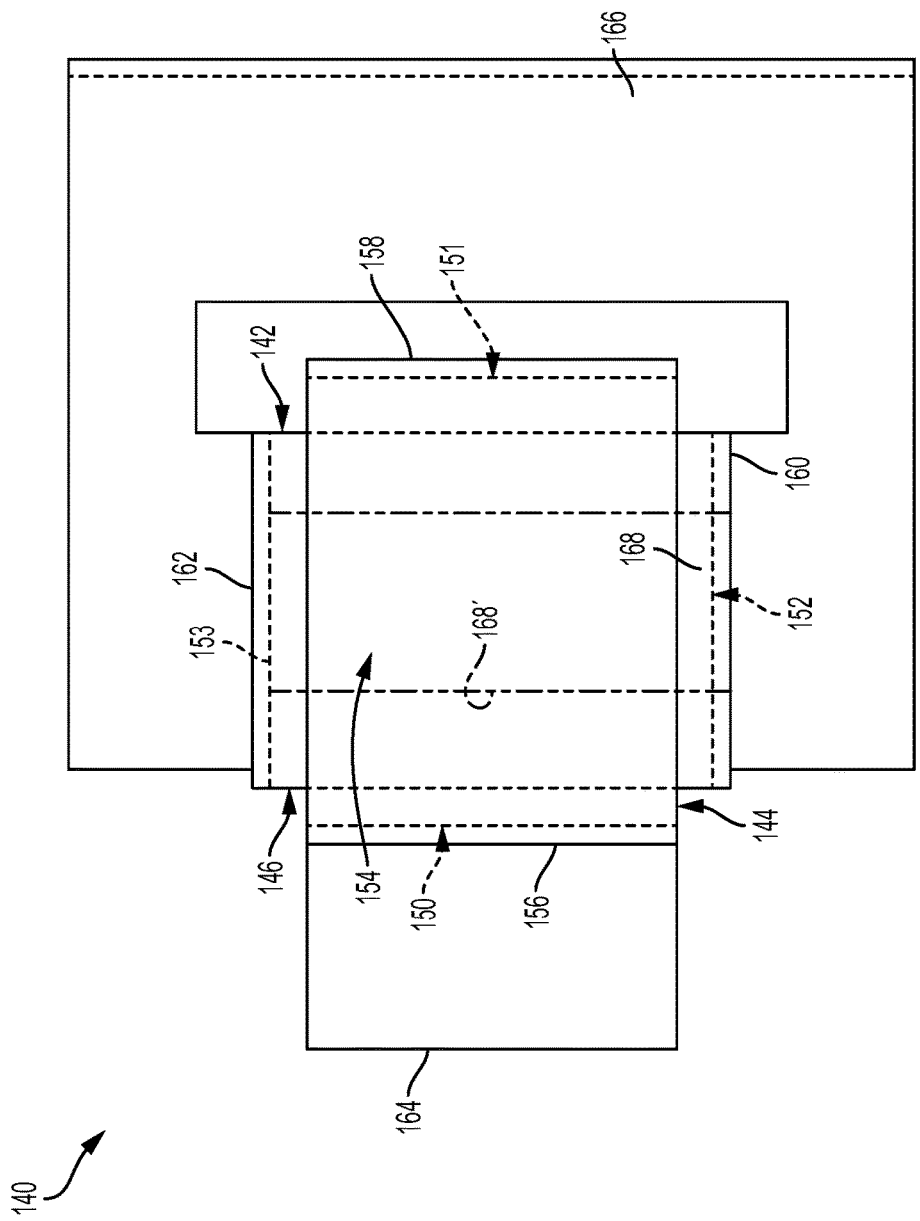
FIG. 8 is a top view of the capacitor of FIG. 7.

Various designs are now presented that are further modifications of the configuration of the basic capacitor shown in FIG. 2. FIG. 7 is an isometric view of an example of a multilayer cross-terminated or X-capacitor 140. FIG. 8 is a top view of capacitor 140. Capacitor 140 includes a capacitor stack 142 including first plate electrodes 144, second plate electrodes 146, and dielectric 148 (between the plate electrodes) supporting the first and second plate electrodes in alternating parallel positions. Capacitor stack 142 includes stack side faces 150, 151, 152, and 153 that are transverse to the planes of the plate electrodes, and stack end faces 154 and 155 that extend along, such as parallel to, the planes of the plate electrodes.

Face terminals 156, 158 cover opposite stack faces 150, 151, respectively, and are attached to respective opposite edges of first plate electrodes 144. Similarly, face terminals 160, 162 cover opposite stack faces 152, 153, respectively, and are attached to respective opposite edges of second plate electrodes 146. A first base conductor 164 mounted on a base substrate, not shown, extends from adjacent stack side face 150 along stack end face 155 and is electrically connected to the bottom edges (as viewed in FIG. 7) of face terminals 156, 158. A second base conductor 166, coplanar with first base conductor 164 is also mounted on the base substrate and extends from the bottom edge of face terminal 160, extends around and spaced from face terminal 158 to the bottom edge of face terminal 162.

In another example, base conductor 166 extends up to the level of the top of capacitor stack 142 and connects to face terminals 160 and 162 at the tops of the face terminals, as represented in dashed lines by base conductor 166', shown in dashed lines. In another example, base conductor 166 extends up to the level of the middle of capacitor stack 142 and connects to face terminals 160 and 162 at the centers of the face terminals, as represented in dashed lines by base conductor 166", also shown in dashed lines. The current paths from an input face terminal to an output face terminal of capacitor 140 travel across the adjacent corners of the capacitor plate electrodes, thereby reducing the current path length overall compared to the basic capacitor of FIG. 2.

A top capacitor plate electrode 168, connected to the left and right face terminals 156, 158, may have a resistance value. Additionally, a second capacitor plate electrode 170, also connected to face terminals 156, 158, may also have a resistance value. In this example, plate electrodes 168, 170 are the two top plate electrodes of plate electrodes 144. In other examples, the plate electrodes having resistance values may have other positions in capacitor stack 142. The resistive plate electrodes 168, 170 may have respective resistances of one ohm per square, 10 ohms per square, 20 ohms per square, 30 ohms per square, 50 ohms per square, or other resistance value. One or both of plate electrodes 168, 170 may have resistance values.

Figure 9:
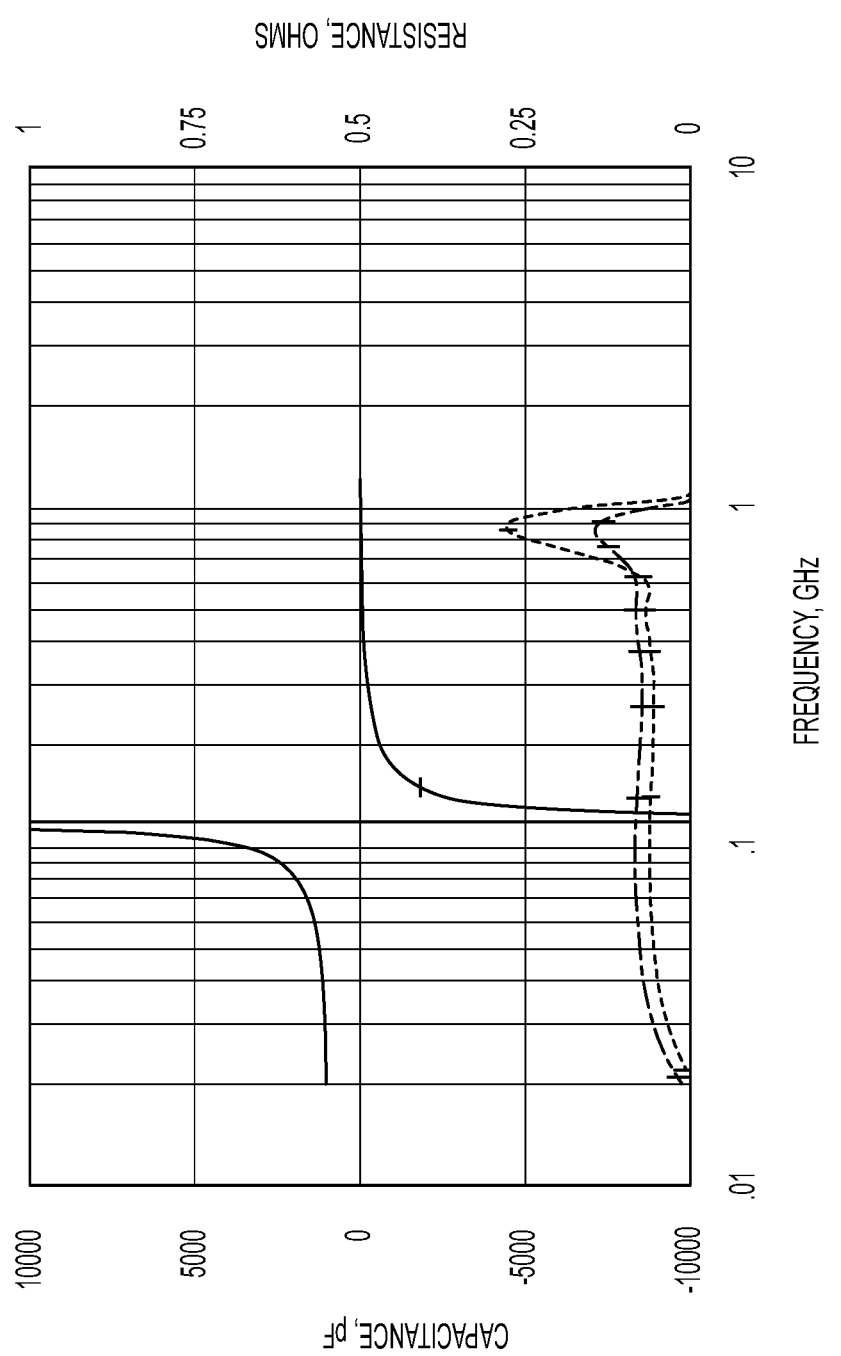
FIG. 9 illustrates simulated capacitance and series resistance as a function of frequency of the capacitor of FIGS. 7 and 8 with and without a single resistance layer.

FIG. 9 shows simulated capacitance and series resistance as a function of frequency of capacitor 140 of FIGS. 7 and 8 for no resistance layer (shown in the dashed line) and with one resistance layer of 50 ohms per square (shown by the dash-dot line). It is seen that the series resistance is less at higher frequencies for the capacitor with plate electrode 168 only being a resistance layer. The capacitance is 1076 pF at 20 MHz. As a reference, a copper film conductor may have a resistance of less then 1 milliohm per square.

Figure 10:
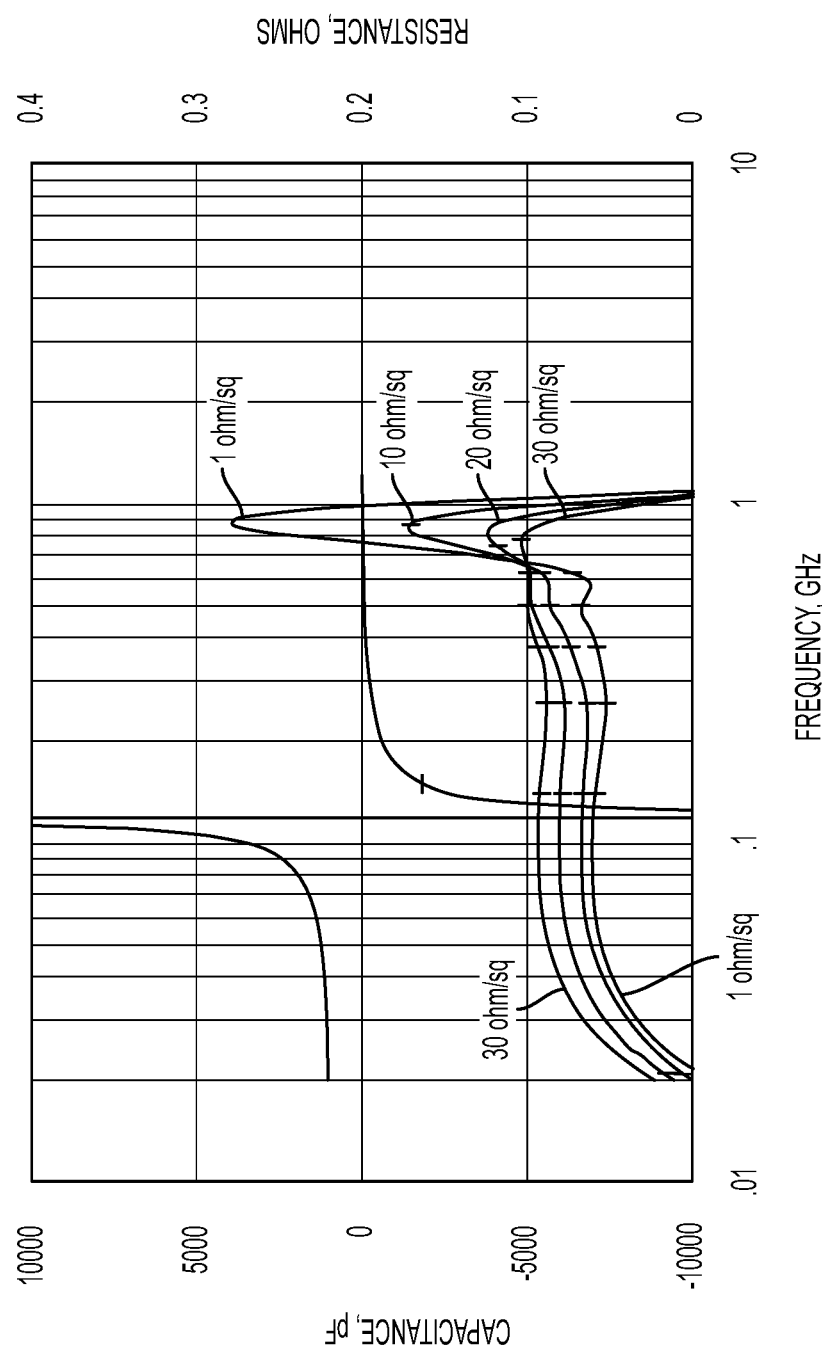
FIG. 10 illustrates simulated capacitance and series resistance as a function of frequency of the capacitor of FIGS. 7 and 8 for a resistance layer having different resistance values.

FIG. 10 shows simulated capacitance and series resistance as a function of frequency of capacitor 140 of FIGS. 7 and 8 in which plate electrodes 168, 170 both have resistance. Four examples of resistance are illustrated: one ohm per square, 10 ohms per square, 20 ohms per square, and 30 ohms per square. It is seen that the series resistance is lower at the lower frequencies and higher at the higher frequencies for lower values of plate electrode resistance. At a resistance of 20 ohms per square the capacitance at 20 MHz is 1076 pF.

A preferred resistance design is for about twice the series resistance at parallel resonance as at low frequency. This is because the capacitor is part of a tuned circuit at 10 or 20 MHz, and the current through it is 40% greater than a 50 ohm line current of the connected microstrips. A 30 ohm per square design gives a nearly flat 0.1 ohm series resistance, but the loss at low frequency is nearly twice the 1 ohm per square design loss. This may be acceptable for a capacitor that is used as an untuned dc block. Two plate electrode layers of 10 ohms per square, or one plate electrode layer of 40 ohms per square provides better overall values.

Rather than use one or more metal plate electrode layers of higher resistivity, the resistive layers can be replaced with capacitor plate electrodes or metal plate electrode layers having narrowed traces near the side metallization areas of the face terminals, such as narrowed plate electrode 168' shown in dash-dot lines in FIG. 8. The areas of selected ones of the top few capacitor plate electrodes are diminished slightly with this design, but the effective contact resistance to those layers is increased, providing resistive damping to the high frequency self resonance. This requires the screening pattern to be different on those top few layers. A combination of resistive layers and reduced face terminal contact areas may be used.

Figure 11:
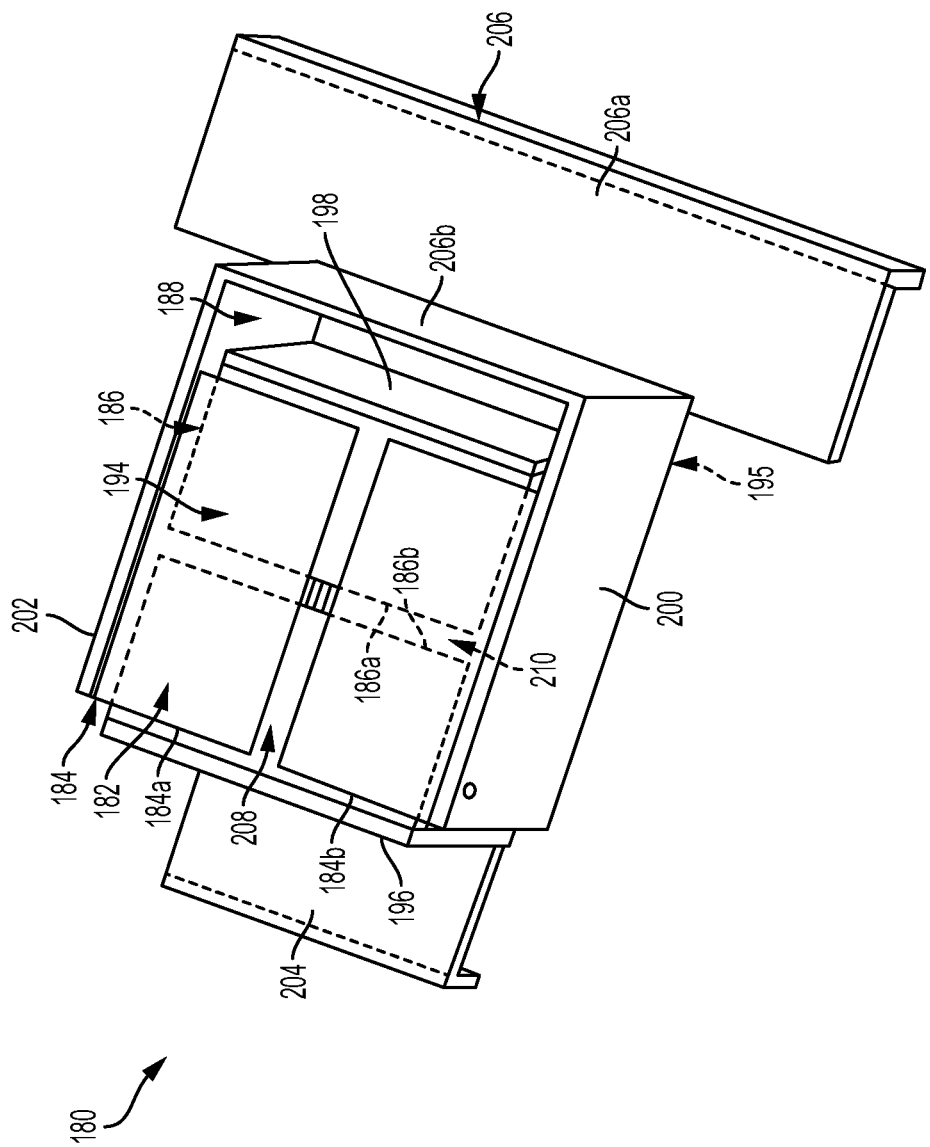
FIG. 11 is an isometric view of an example of a multilayer cross-terminated capacitor having each plate electrode formed of spaced-apart plate electrode portions.
Figure 12:
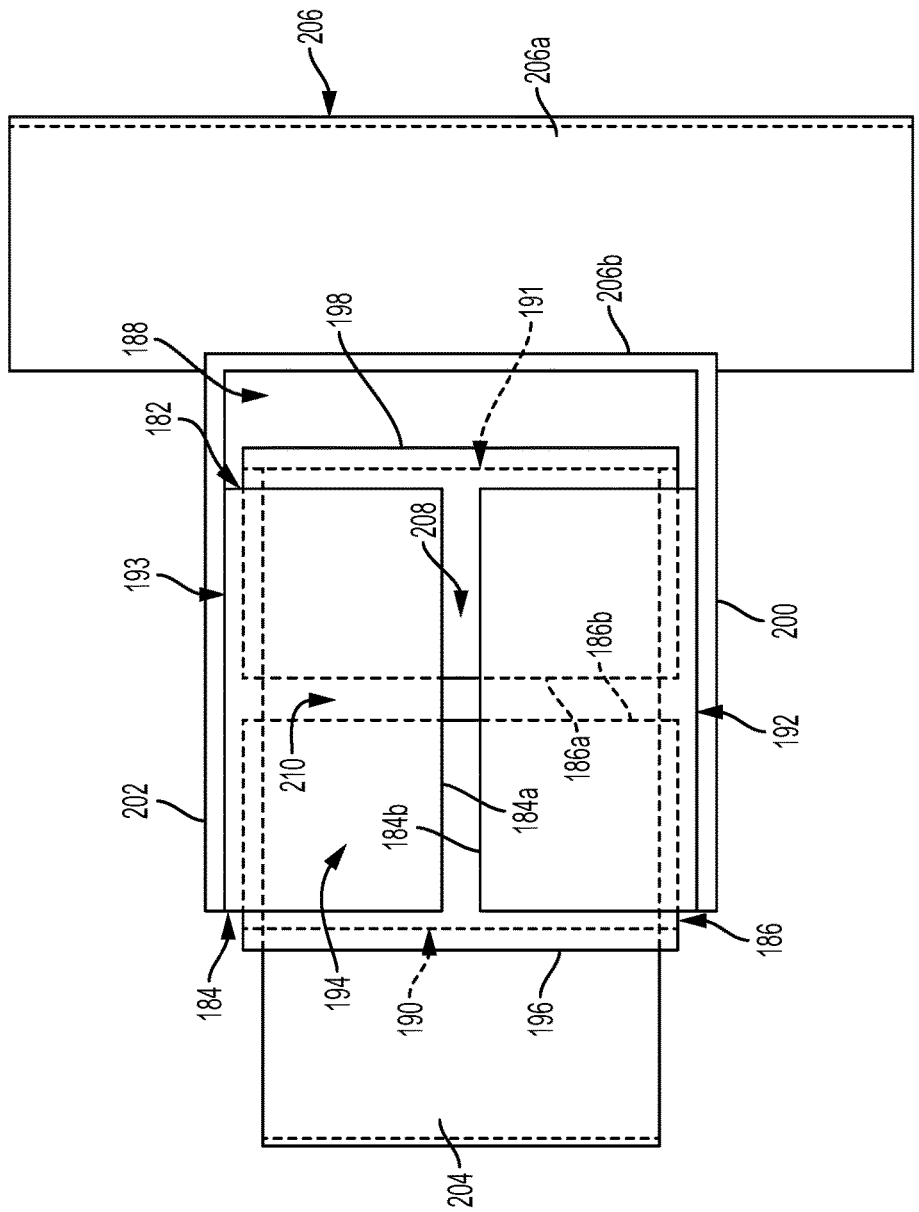
FIG. 12 is a top view of the capacitor of FIG. 11.

FIG. 11 is an isometric view of an example of a multilayer cross-terminated capacitor 180. FIG. 12 is a top view of the capacitor of FIG. 11. Capacitor 180 includes a capacitor stack 182 including first plate electrodes 184, second plate electrodes 186, and a dielectric 188 (between the plate electrodes and between capacitor stack 182 and the base conductor described below) supporting the first and second plate electrodes in alternating parallel positions. In this example each plate electrode is formed of spaced-apart plate electrode portions separated by a gap. In particular, plate electrodes 184 are formed of coplanar plate electrode portions 184a and 184b having adjacent edges separated by a gap 208. Similarly, plate electrodes 186 are formed of coplanar plate electrode portions 186a and 186b having adjacent edges separated by a gap 210. In this example, the plate electrode portions and gaps are the same size and uniform for both plate electrodes 184, 186, although the plate electrode portions and gaps may be of different respective sizes and may vary within capacitor stack 182.

Capacitor stack 182 includes stack side faces 190, 191, 192, and 193 that are transverse to the planes of the plate electrodes, and stack end faces 194 and 195 that extend along, such as parallel to, the planes of the plate electrodes.

Face terminals 196, 198 cover opposite stack faces 190, 191, respectively, and are attached to respective opposite edges of first plate electrodes 184. Similarly, face terminals 200, 202 cover opposite stack faces 192, 193, respectively, and are attached to respective opposite edges of second plate electrodes 186. A first base conductor 204 mounted on a base substrate, not shown, extends from adjacent stack side face 190 along stack end face 195 and is electrically connected to the bottom edges (as viewed in FIG. 11) of face terminals 196, 198. A second base conductor 206 includes a base portion 206a coplanar with first base conductor 204 mounted on the base substrate. In this example, second base conductor 206 includes a vertical portion 206b that extends from an edge of base portion 206a adjacent to and spaced from face terminal 198. Vertical portion 206b wraps around from a vertical edge of face terminal 200, along base portion 206a, parallel to and spaced from face terminal 198, and around to a vertical edge of face terminal 202.

Figure 13:
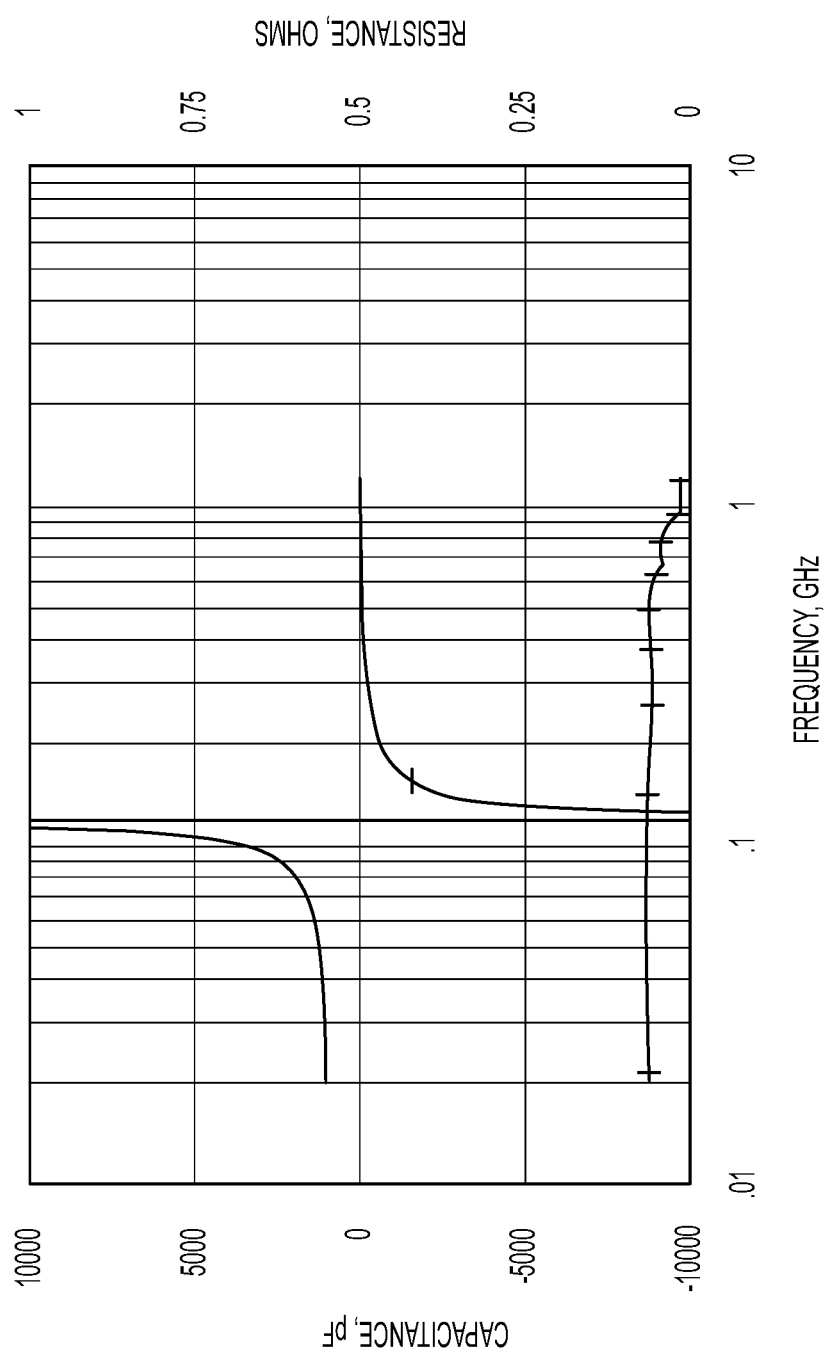
FIG. 13 illustrates simulated capacitance and series resistance as a function of frequency of the capacitor of FIGS. 11 and 12.

FIG. 13 is a chart showing simulated capacitance and series resistance as a function of frequency for capacitor 180 of FIGS. 11 and 12. The capacitance is about 1161 pF at 20 MHz. The series resistance is below about 0.17 ohms for the frequency bandwidth shown between 11 MHz and about 1.1 GHz.

Figure 14:
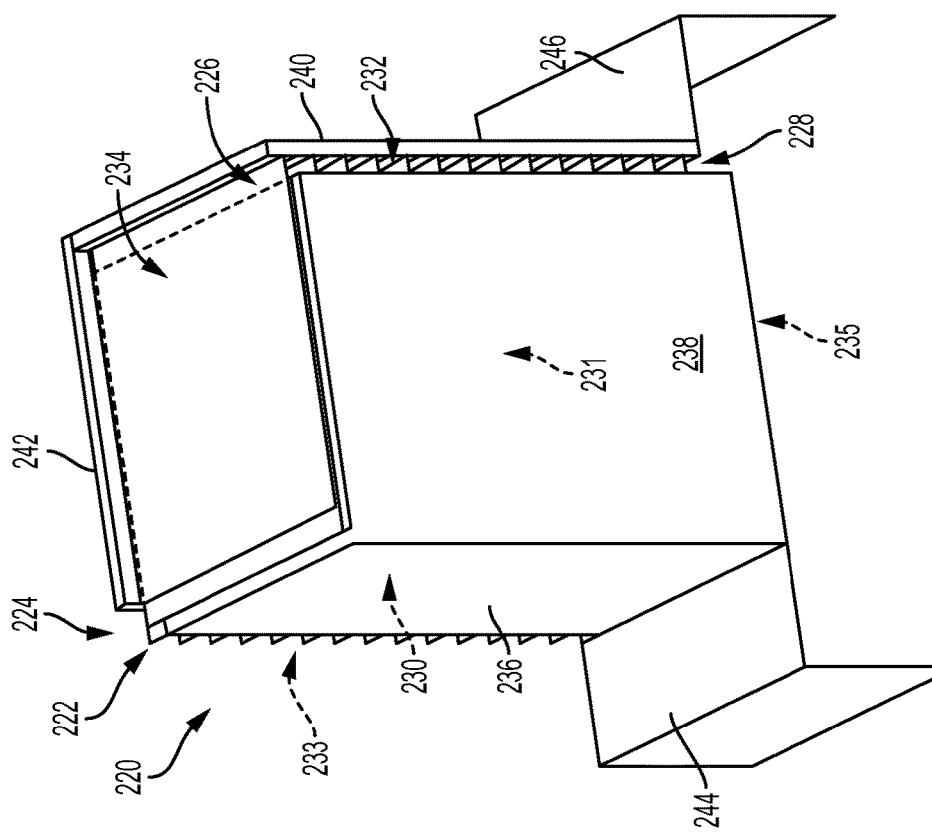
FIG. 14 is an isometric view of an example of a multilayer capacitor having face terminals for a common set of plate electrodes on two adjacent side faces of the capacitor stack.

FIG. 14 is an isometric view of an example of a multilayer capacitor 220. In this example, each capacitor face terminal wraps around a common corner of the stack of capacitor plate electrode layers, forming a V-shaped terminal. The two opposite terminals are facing V-shaped terminals, forming in combination what may be considered a diamond or corner-wrap shape. This terminal configuration also provides current paths that extend across the opposite corners where there are gaps between the opposite face terminals.

More specifically, capacitor 220 includes a capacitor stack 222 including first plate electrodes 224, second plate electrodes 226, and a dielectric 228 (between the plate electrodes) supporting the first and second plate electrodes in alternating parallel positions. Capacitor stack 222 includes stack side faces 230, 231, 232, and 233 (hidden from view in FIG. 14) that are transverse to the planes of the plate electrodes, and top stack end face 234 and bottom end face 235 (hidden from view) that extend along, such as parallel to, the planes of the plate electrodes.

Face terminals 236, 238 cover adjacent stack faces 230, 231, respectively, are attached together along a common edge, and are attached to respective adjacent edges of first plate electrodes 224. Similarly, face terminals 240, 242 cover adjacent stack faces 232, 233, respectively, are attached along a common edge and are attached to respective adjacent edges of second plate electrodes 226. A first base conductor 244 mounted on a base substrate, not shown, extends along the lower edge of and is connected to face terminal 236 and to face terminal 238 via face terminal 236. A second base conductor 246 is coplanar with first base conductor 244, is mounted on the base substrate, extends along and in contact with face terminal 240, and is electrically connected to face terminal 242 via face terminal 240.

Figure 15:
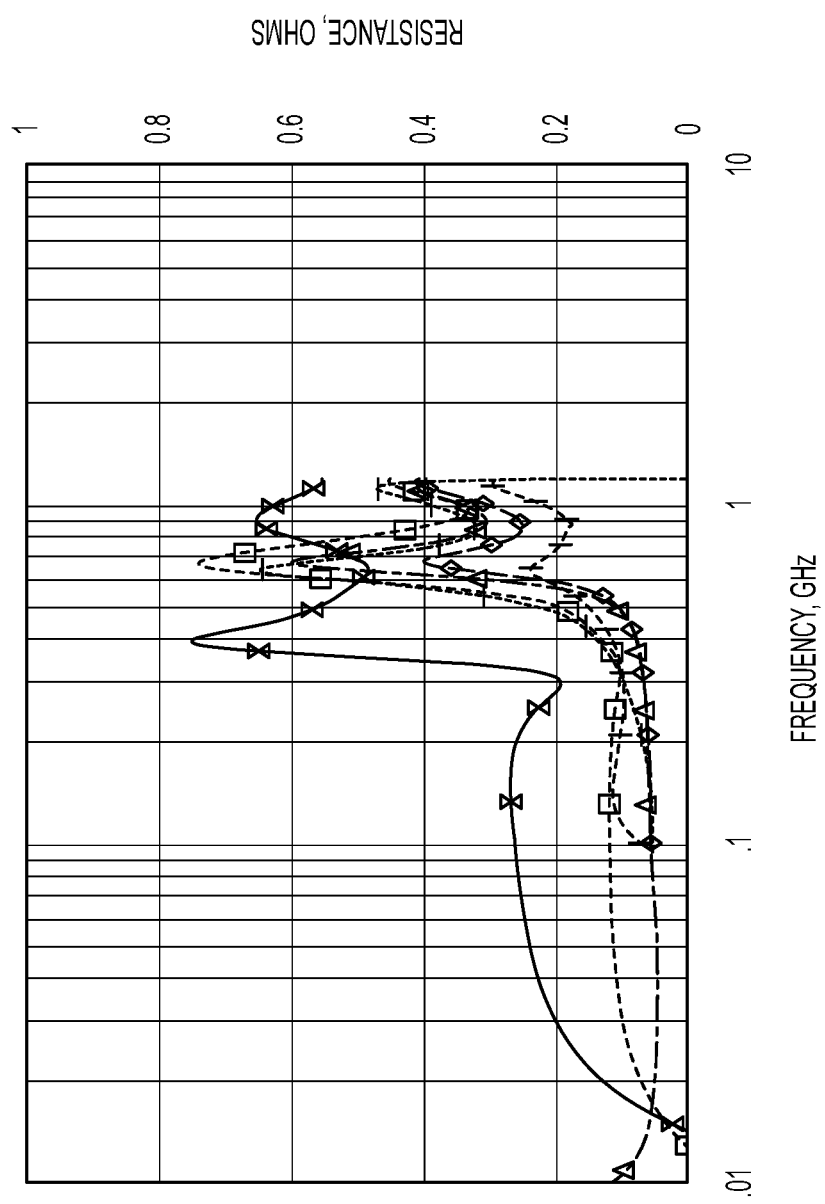
FIG. 15 illustrates simulated series resistance as a function of frequency for different multilayer capacitor configurations.

FIG. 15 shows simulations of the series resistances for different multilayer capacitor configurations.

A. The trace with the hourglass symbol, which trace has the highest overall resistance values of those shown, is capacitor 50 shown in FIG. 2 with opposite terminals that are each fed from the bottom of the capacitor stack at the microstrip level.

B. The trace with the square symbols is for multilayer capacitor 220 having the diamond or corner-wrap configuration with face terminals fed by base conductors 244 and 246 from the bottom at opposite, left and right ends as shown in FIG. 14 and without a resistor plate electrode layer in capacitor stack 222 as was described for capacitor 140. This trace has resistance values generally lower than those of the trace for capacitor 50.

C. The trace with the triangle symbols is for multilayer capacitor 220 shown in FIG. 14 except the right face terminals 240, 242 are fed from the bottom of the rear portion of face terminal 242 instead of from the right as shown in FIG. 14. The trace for the rear feed indicated by the triangle symbols is seen to indicate resistances that are below those of the configuration shown in FIG. 14. The rear lower terminal feed can be provided by the rear feed portion of base conductor 166 shown in FIG. 7.

D. The trace with the diamond symbols is for multilayer capacitor 220 shown in FIG. 14 except the right face terminals 240, 242 are fed from the top of the rear portion of the right terminal. The trace for the top rear feed configuration is seen to indicate resistances that are similar to those of the bottom rear feed configuration at lower frequencies, but that are less than those of the bottom rear feed configuration at higher frequencies. The top rear feed can be provided by the top rear feed portion of base conductor 166' shown in FIG. 7.

E. The trace with the vertical-line symbols is for multilayer capacitor 220 shown in FIG. 14 except the right face terminals 240, 242 are fed by base conductor 246 from the tops of both of the rear face terminal 242 and right face terminal 240 and the left face terminals 236, 238 are fed by base conductor 244 from the bottoms of both of face terminals 236, 238. The trace for this configuration is seen to indicate resistances that are generally above those of the configuration fed from the bottom of the rear face terminal 242 represented by the triangle symbols at lower frequencies, but that are the lowest of all the configurations represented at higher frequencies.

F. The trace with no symbol is the same configuration as capacitor 50 except the capacitor stack is rotated 90-degrees to the side so that the capacitor plates extend vertically, as is shown for capacitors 92 94 illustrated in FIG. 4. The trace for the rotated-stack configuration is seen to be well below the trace for capacitor 50 at all frequencies, similar to the trace for capacitor 220 with a rear feed to face terminal 242 at the lowest frequencies and for a portion of the higher frequencies, and close to the same as the trace for capacitor 220 as shown in FIG. 14 for intermediate frequencies.

Figure 16:
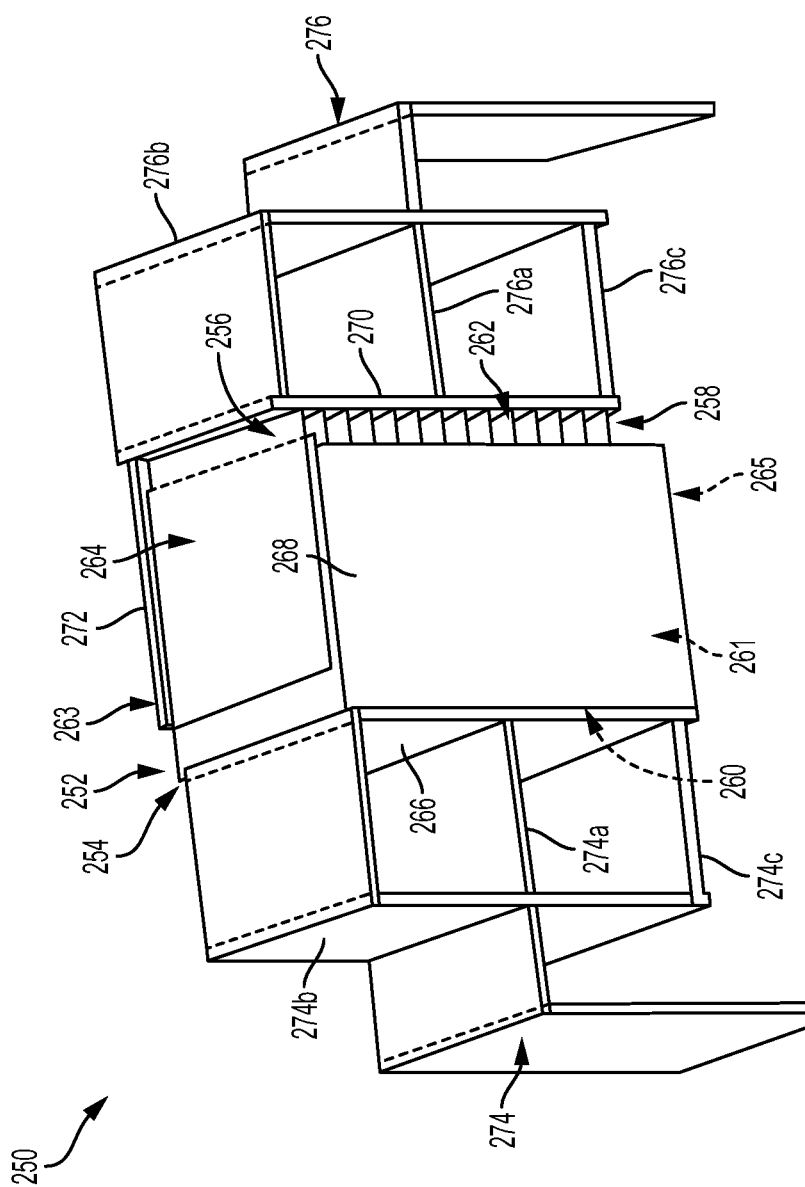
FIG. 16 is an isometric view of an example of a capacitor in which opposite side face terminals have three concurrent feeds.

FIG. 16 is an isometric view of an example of a diamond or corner wrap-around capacitor 250 in which the opposite side terminals have three concurrent feeds: one at the bottom, one at the top, and one in the middle or center. FIG. 14 illustrates an example of a diamond capacitor having only bottom fed terminals. In other examples, the terminal could be fed from the top only, from the middle only, or a combination of two of the feeds such as top and bottom only. In other examples, the terminals could be fed by more than three feeds, or by two or more feeds at intermediate positions on the terminals, such as two feeds each one-fourth or one-third of the way from an end.

More specifically, capacitor 250 includes a capacitor stack 252 that is in this example the same as capacitor stack 222 of capacitor 220. Capacitor stack 252 includes first plate electrodes 254, second plate electrodes 256, and a dielectric 258 (between the plate electrodes) supporting the first and second plate electrodes in alternating parallel positions. Capacitor stack 252 includes stack side faces 260, 261, 262, and 263 (hidden from view in FIG. 16) that are transverse to the planes of the plate electrodes, and top stack end face 264 and bottom end face 265 (hidden from view) that extend along, such as parallel to, the planes of the plate electrodes.

Face terminals 266, 268 cover adjacent stack faces 260, 261, respectively, are attached together along a common edge, and are attached to respective adjacent edges of first plate electrodes 254. Similarly, face terminals 270, 272 cover adjacent stack faces 262, 263, respectively, are attached along a common edge and are attached to respective adjacent edges of second plate electrodes 256.

A first base conductor 274 mounted on a base substrate, not shown, extends in a plane along a center feed portion 274a aligned with a center of capacitor stack 252 to a center position of face terminal 266. Base conductor 274 divides at a position spaced from face terminal 266 up and down vertically to a top-feed portion 274b and a bottom-feed portion 274c. Top feed portion 274b extends up to a position in line with a top edge of face terminal 266 and then extends horizontally to connect along the top edge of face terminal 266. Bottom feed portion 274c extends down to a position in line with a bottom edge of face terminal 266 and then extends horizontally to connect along the bottom edge of face terminal 266. First base conductor 274 is connected to face terminal 268 via face terminal 266.

A second base conductor 276, similar to first base conductor 274, mounted on a base substrate, not shown, extends in a plane along a center feed portion 276a aligned with a center of capacitor stack 252 to a center position of face terminal 270. Base conductor 276 divides at a position spaced from face terminal 270 up and down vertically to a top-feed portion 276b and a bottom-feed portion 276c. Top feed portion 276b extends up to a position in line with a top edge of face terminal 270 and then extends horizontally to connect along the top edge of face terminal 270. Bottom feed portion 276c extends down to a position in line with a bottom edge of face terminal 270 and then extends horizontally to connect along the bottom edge of face terminal 270. Second base conductor 276 is connected to face terminal 272 via face terminal 270. and is electrically connected to face terminal 272 via face terminal 270.

Figure 17:
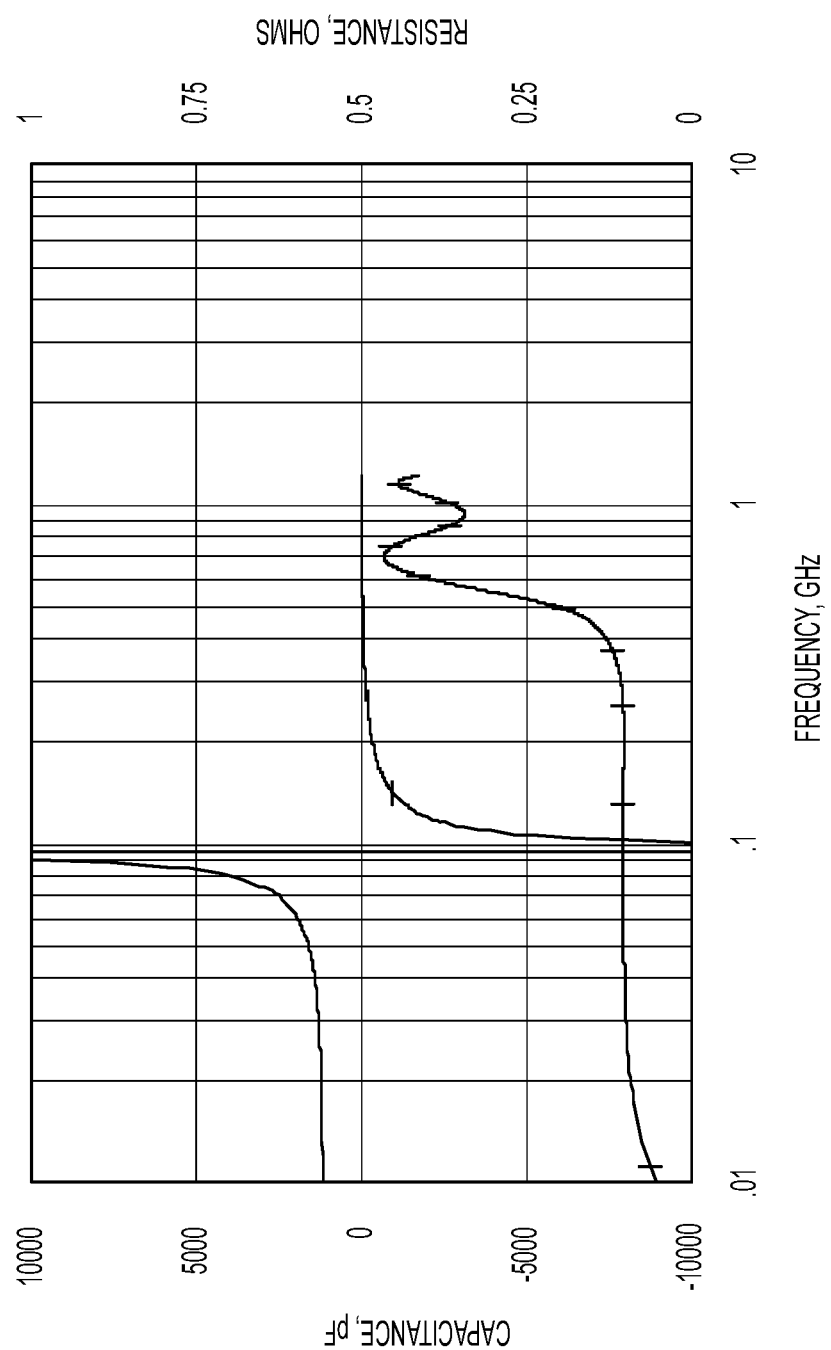
FIG. 17 illustrates simulated capacitance and series resistance as a function of frequency of the capacitor of FIG. 16.

FIG. 17 illustrates simulated capacitance and series resistance as a function of frequency of diamond capacitor 250 of FIG. 16. The series resistance is seen to peak at less than 0.5 ohms at slightly less than 700 MHz. The capacitance is about 1180 pF at 15.7 MHz.

Figure 18:
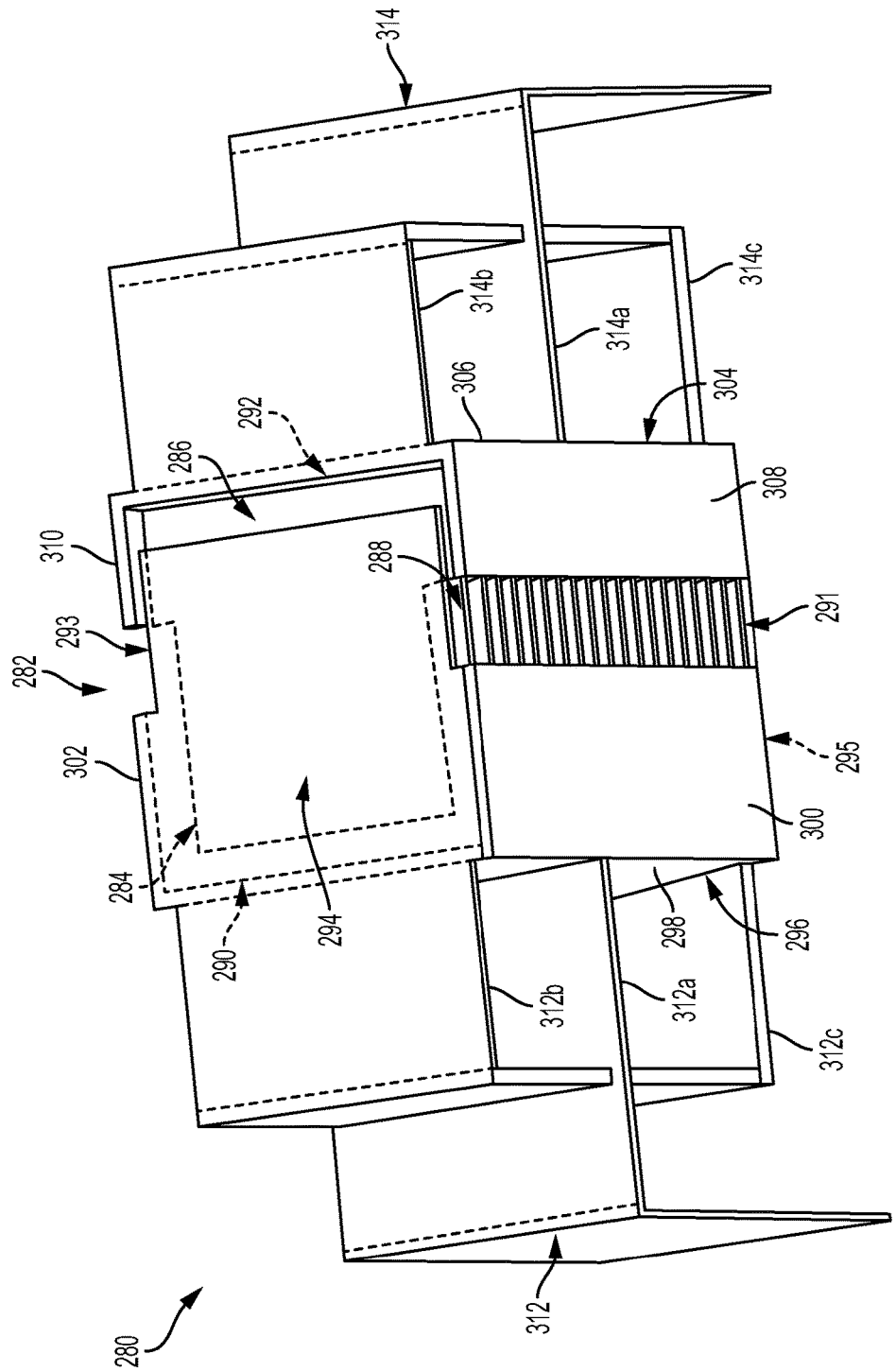
FIG. 18 is an isometric view of an example of a multilayer capacitor having opposite terminals that each extends around adjacent corners of the stack of capacitor plates.

FIG. 18 is an isometric view of a multilayer capacitor 280 having opposite face terminal assemblies that each extends around adjacent corners of the stack of capacitor plate electrodes. This capacitor may be considered to have a dog-bone or wrap-around face terminal configuration. In this example, each face terminal assembly has three feeds like the three feeds for capacitor 250 and the two face terminal assemblies wrap-around the stack to different extents. The wrap-around portions on the left face terminal assembly extend a little less than half way along opposite stack sides, and the wrap-around portions on the right face terminal assembly extend about one-third of the way along the same stack sides. This leaves a gap between the end edges of the two face terminal assemblies of about one-fourth of the lengths of the respective stack sides. In other examples, the sides wrap around other extents. For example, the side portions of the two face terminal assemblies may extend along equal portions of the sides.

Capacitor 280 includes a capacitor stack 282. Capacitor stack 282 includes first plate electrodes 284, second plate electrodes 286, and a dielectric 288 (between the plate electrodes) supporting the first and second plate electrodes in alternating parallel positions. Capacitor stack 282 includes stack side faces 290, 291, 292, and 293 (hidden from view in FIG. 18) that are transverse to the planes of the plate electrodes, and top stack end face 294 and bottom end face 295 (hidden from view) that extend along, such as parallel to, the planes of the plate electrodes.

A first face terminal assembly 296 includes a face terminal 298 covering stack side face 290, a face terminal 300 connected to face terminal 298 along a common edge and covering a portion of stack side face 291, and a face terminal 302 connected to face terminal 298 along a common edge and covering a portion of stack side face 293. The face terminals in first face terminal assembly 296 are connected to respective edges of first plate electrodes 284.

A second face terminal assembly 304 includes a face terminal 306 covering stack side face 292 opposite stack side face 290, a face terminal 308 connected to face terminal 306 along a common edge and covering a portion of stack side face 291, and a face terminal 310 connected to face terminal 306 along a common edge and covering a portion of stack side face 293. The face terminals in second face terminal assembly 304 are connected to respective edges of second plate electrodes 286.

A first base conductor 312 mounted on a base substrate, not shown, extends in a plane along a center feed portion 312a aligned with a center of capacitor stack 282 to a center position of face terminal 298. Base conductor 312 divides at a position spaced from face terminal 298 up and down vertically to a top-feed portion 312b and a bottom-feed portion 312c. Top feed portion 312b extends up to a position in line with a top edge of face terminal 298 and then extends horizontally to connect along the top edge of face terminal 298. Bottom feed portion 312c extends down to a position in line with a bottom edge of face terminal 298 and then extends horizontally to connect along the bottom edge of face terminal 298. First base conductor 312 is connected to face terminals 300 and 302 via face terminal 298.

A second base conductor 314 mounted on a base substrate, not shown, extends in a plane along a center feed portion 314a aligned with a center of capacitor stack 282 to a center position of face terminal 306. Base conductor 314 divides at a position spaced from face terminal 306 up and down vertically to a top-feed portion 314b and a bottom-feed portion 314c. Top feed portion 314b extends up to a position in line with a top edge of face terminal 306 and then extends horizontally to connect along the top edge of face terminal 306. Bottom feed portion 314c extends down to a position in line with a bottom edge of face terminal 306 and then extends horizontally to connect along the bottom edge of face terminal 306. Second base conductor 314 is connected to face terminals 308 and 310 via face terminal 306.

Figure 19:
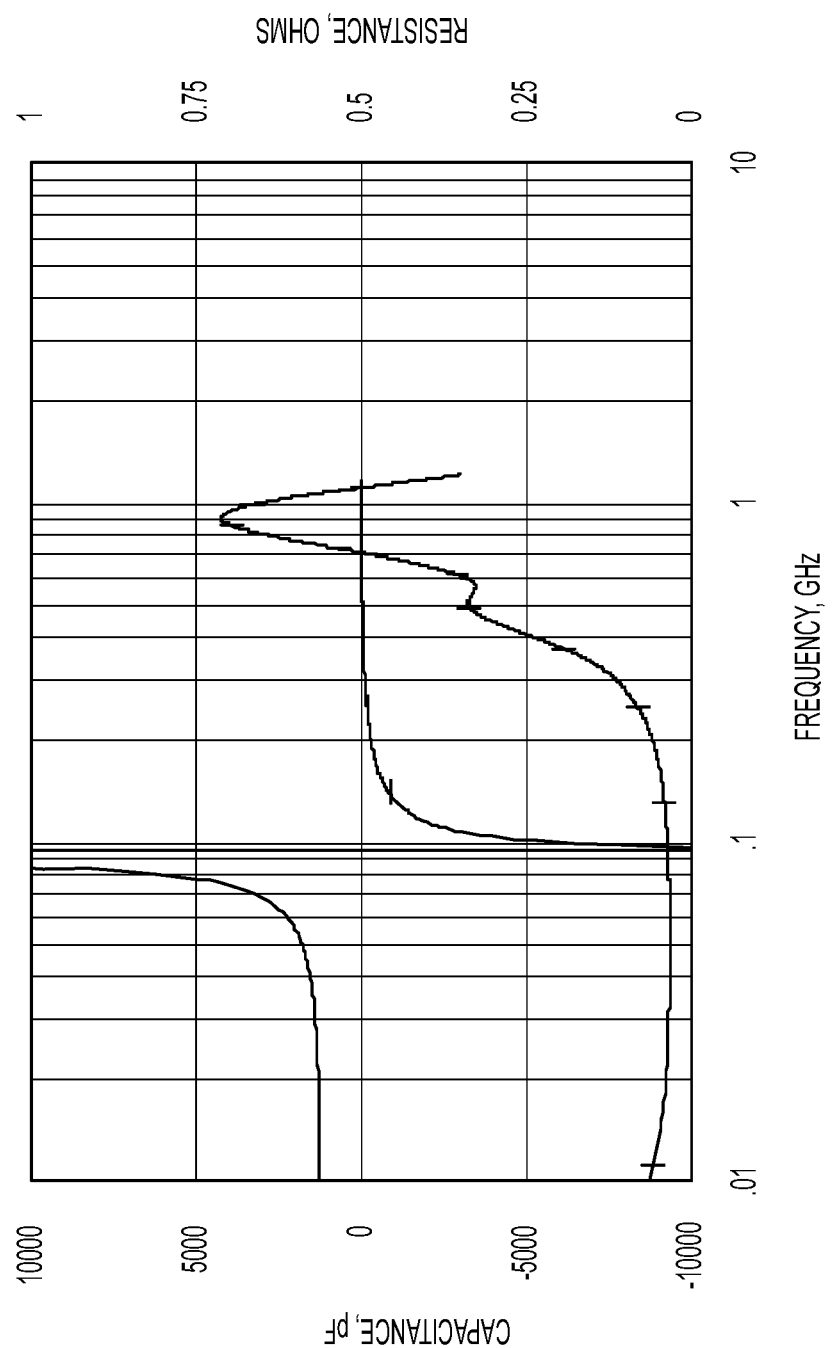
FIG. 19 illustrates simulated capacitance and series resistance as a function of frequency of the capacitor of FIG. 18.

FIG. 19 illustrates simulated capacitance and series resistance as a function of frequency of dog-bone capacitor 280 of FIG. 18. The series resistance is seen to peak at less than 0.75 ohms at about 900 MHz. The capacitance is about 1289 pF at about 15.7 MHz.

Figure 20:
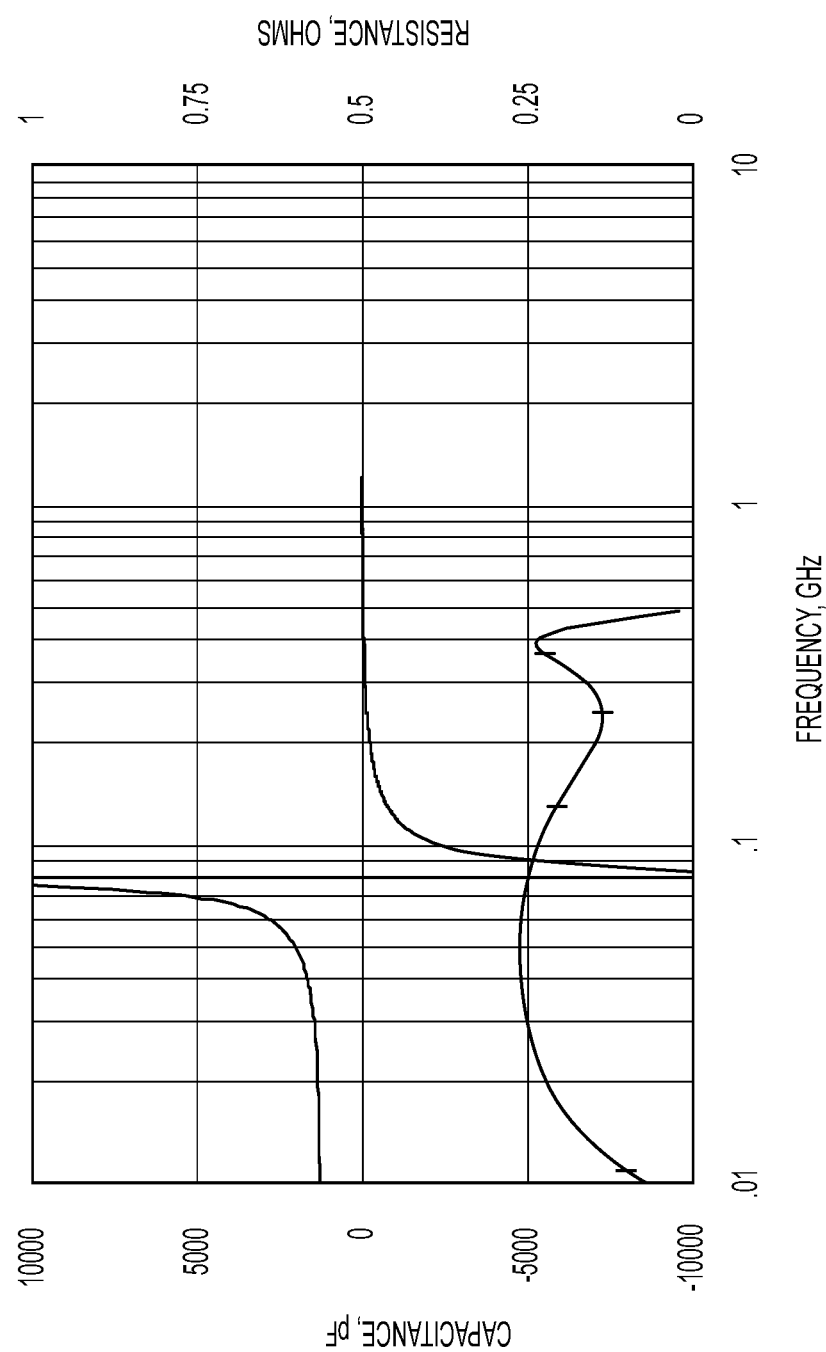
FIG. 20 illustrates simulated capacitance and series resistance as a function of frequency of a multilayer capacitor as shown in FIG. 2 in which the dielectric over the capacitor chip is air and the dielectric below the capacitor chip is a dielectric.

FIG. 20 illustrates simulated capacitance and series resistance as a function of frequency of a multilayer capacitor as shown in FIG. 2 in which the dielectric over the capacitor chip is air and the dielectric below the capacitor chip is a printed circuit board (PCB) substrate dielectric. It is seen that the series resistance is about 0.25 ohm for frequencies between 20 MHz and 100 MHz, and has a local peak at about 400 MHz that is also about 0.25 ohm. The capacitance at about 15.7 MHz is about 1296 pF.

Figure 21:
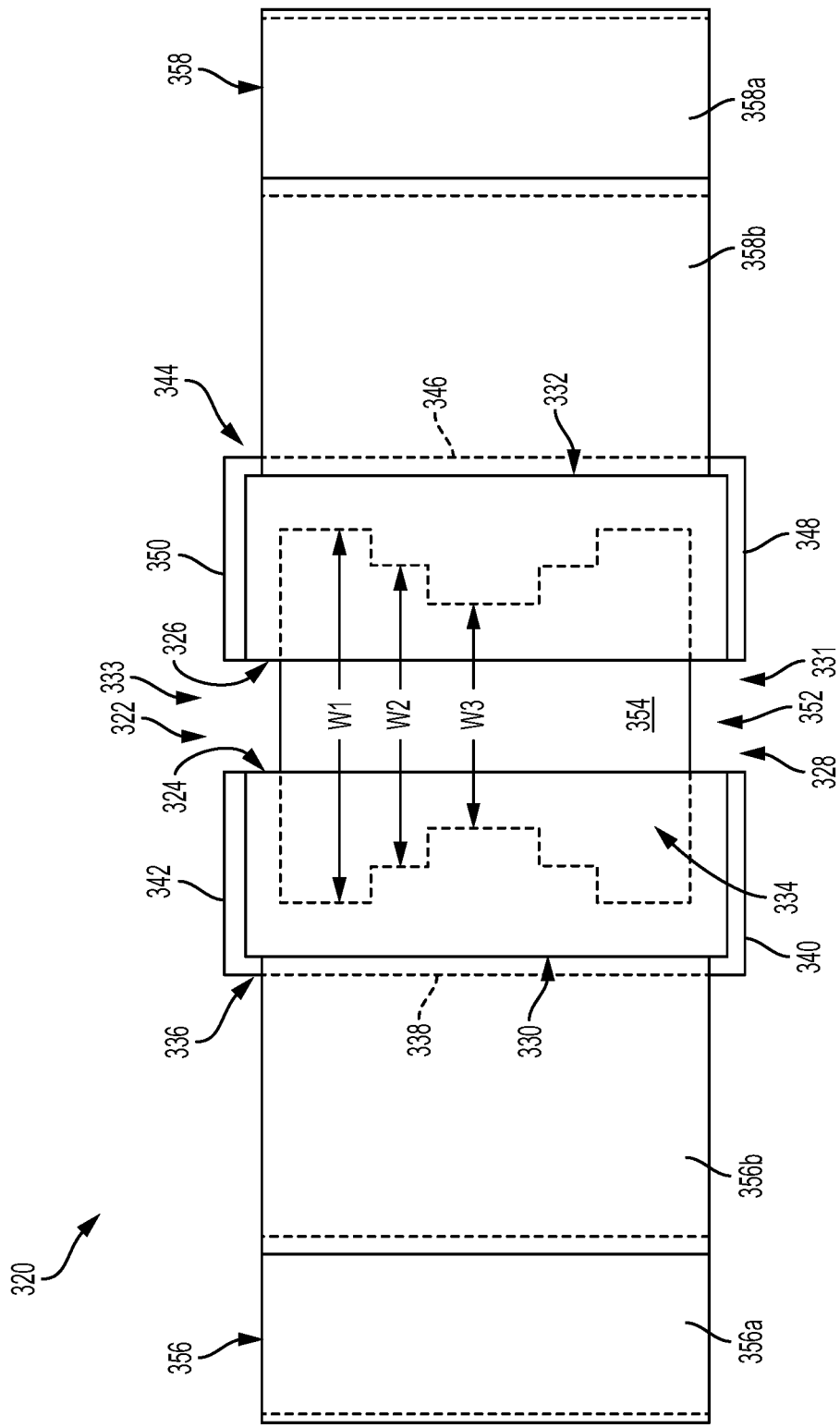
FIG. 21 is a top view of an example of a capacitor having face terminals each extending along three stack sides and coplanar opposing first and second plate electrodes with intermediate plate electrodes interposed between layers of opposing first and second plate electrodes.

FIG. 21 is a top view of an example of a dog-bone wrap-around capacitor 320 having face terminal assemblies extending along equal lengths of opposite capacitor stack sides. The first and second plate electrodes are coplanar, are attached to the opposite face terminal assemblies, and are truncated so there is a gap between them, as shown. Alternating between the layers of coplanar, terminal-connected plate electrodes are floating intermediate plate electrodes not connected to either face terminal assembly. The floating intermediate plate electrodes shown have varying dimensions in width between the face terminal ends, with the floating intermediate plate electrodes having a thinnest dimension in the middle. The floating intermediate plate electrodes may vary in length in different configurations, such as linearly varying, continuously varying, and varying in discreet steps as shown. The example shown has three dimensions that step-down in two discreet steps from an outer dimension to a middle inner dimension.

Referring to FIG. 21, capacitor 320 is constructed similar to capacitor 280 except the face terminal assemblies wrap around equal portions of the capacitor stack sides and the plate electrodes are configured differently. Specifically, capacitor 320 includes a capacitor stack 322. Capacitor stack 322 includes first plate electrodes 324, second plate electrodes 326, and dielectric 328 (between the plate electrodes) supporting the first and second plate electrodes in alternating parallel positions. Capacitor stack 322 includes stack side faces 330, 331, 332, and 333 that are transverse to the planes of the plate electrodes, and top stack end face 334 and a bottom end face hidden from view that extend along, such as parallel to, the planes of the plate electrodes.

A first face terminal assembly 336 includes a face terminal 338 covering stack side face 330, a face terminal 340 connected to face terminal 338 along a common edge and covering a portion of stack side face 331, and a face terminal 342 connected to face terminal 338 along a common edge and covering a portion of stack side face 333. The face terminals in first face terminal assembly 336 are connected to respective edges of first plate electrodes 324.

A second face terminal assembly 344 includes a face terminal 346 covering stack side face 332 opposite stack side face 330, a face terminal 348 connected to face terminal 346 along a common edge and covering a portion of stack side face 331, and a face terminal 350 connected to face terminal 346 along a common edge and covering a portion of stack side face 333. The face terminals in second face terminal assembly 344 are connected to respective edges of second plate electrodes 326.

As seen, first plate electrodes 324 and second plate electrodes 326 are coplanar and each extends less than half way between opposite capacitor stack sides 330 and 332. This leaves a gap 352 between facing edges of the respective first and second plate electrodes. In between layers of first and second plate electrodes are intermediate plate electrodes 354 spaced from the first and second plate electrodes.

Intermediate plate electrodes 354 may be said to float in capacitor stack 322 because they are surrounded entirely by dielectric 328 and are not physically or electrically connected directly or indirectly to either of face terminal assemblies 336 and 344.

Intermediate plate electrodes 354 have outer edges facing and extending along respective capacitor stack sides 330 and 332. The width of the intermediate plate electrodes varies along the lengths of the outer edges and are wider adjacent capacitor stack sides 331 and 333 than in an intermediate or center position. In this example, the width steps down from both ends of the outer edges of the intermediate plate electrodes from a relatively wide width W1, to an intermediate width W2, and to a relatively narrow width W3 at a center region of the intermediate plate electrodes.

A first base conductor 356 mounted on a base substrate, not shown, extends in a plane along a center feed portion 356a aligned with a center of capacitor stack 322 to a center position of face terminal 338. Base conductor 356 divides at a position spaced from face terminal 338 up and down vertically to a top-feed portion 356b and a bottom-feed portion hidden from view. Top feed portion 356b extends up to a position in line with a top edge of face terminal 338 and then extends horizontally to connect along the top edge of face terminal 338. The bottom feed portion extends down to a position in line with a bottom edge of face terminal 338 and then extends horizontally to connect along the bottom edge of face terminal 338. First base conductor 356 is connected to face terminals 340 and 342 via face terminal 338.

A second base conductor 358 mounted on a base substrate, not shown, extends in a plane along a center feed portion 358a aligned with a center of capacitor stack 322 to a center position of face terminal 346. Base conductor 358 divides at a position spaced from face terminal 346 up and down vertically to a top-feed portion 358b and a bottom-feed portion hidden from view. Top feed portion 358b extends up to a position in line with a top edge of face terminal 346 and then extends horizontally to connect along the top edge of face terminal 346. The bottom feed portion extends down to a position in line with a bottom edge of face terminal 346 and then extends horizontally to connect along the bottom edge of face terminal 346. Second base conductor 358 is connected to face terminals 348 and 350 via face terminal 346.

Figure 22:
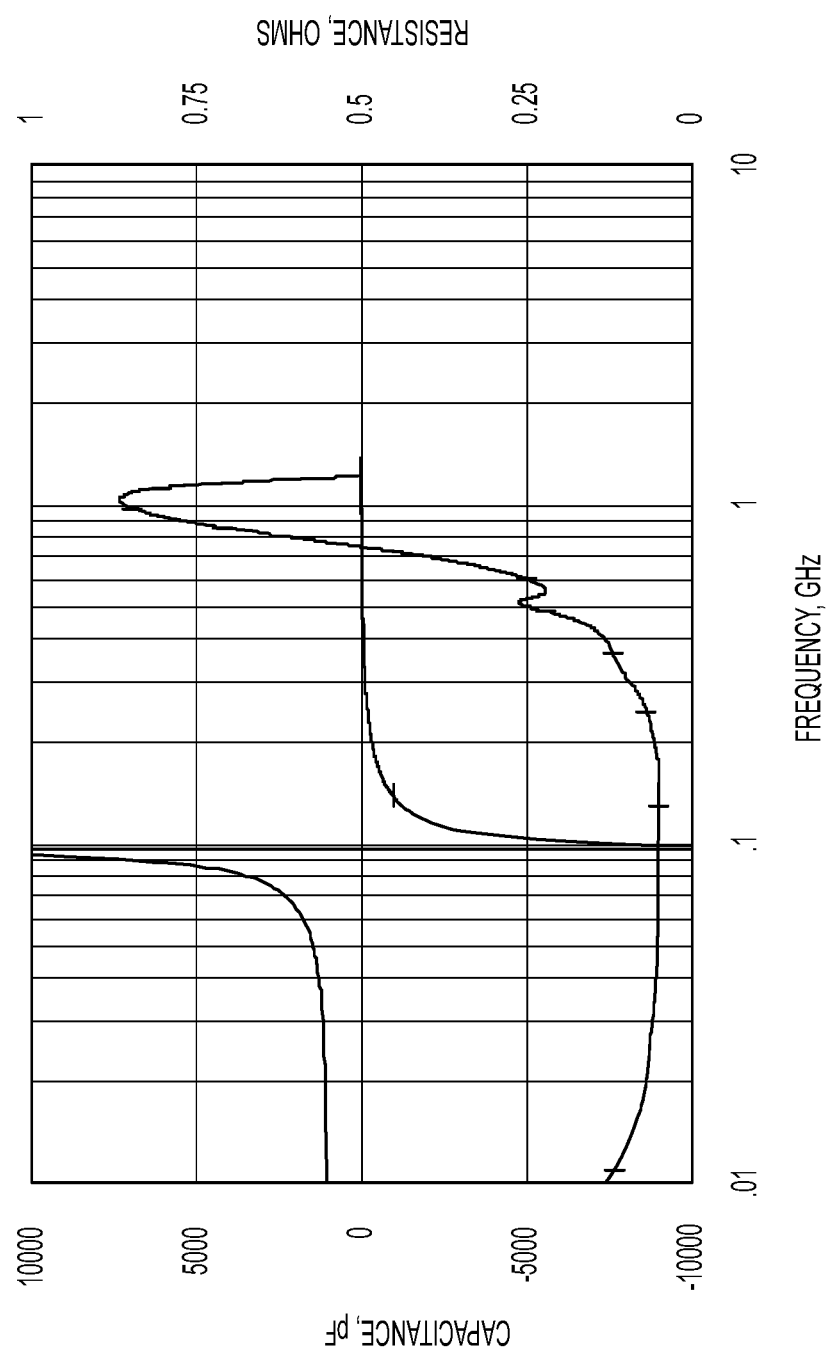
FIG. 22 illustrates simulated capacitance and series resistance as a function of frequency of the capacitor shown in FIG. 21.

FIG. 22 illustrates simulated capacitance and series resistance as a function of frequency of the dog-bone wrap-around multilayer capacitor shown in FIG. 21. The series resistance below about 400 MHz is well below 0.25 ohms and it reaches a peak of about 0.85 ohms at 1 GHz. The capacitance at about 15.7 MHz is 1067 pF.

This section describes additional aspects and features of multilayer capacitors, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A1. A capacitor assembly comprising at least a first multilayer capacitor comprising physically and electrically spaced-apart coplanar first and second base conductors, each of the first and second base conductors configured to be electrically connected to respective different first and second external conductors of an external circuit; a first capacitor stack having a plurality of first plate electrodes, a plurality of second plate electrodes, and a first dielectric body supporting the first and second plate electrodes in spaced apart positions, the first capacitor stack having a first plurality of stack side faces transverse to planes of the first and second plate electrodes, the first capacitor stack being supported relative to the first and second base conductors with one of the first plurality of stack side faces facing and extending along a plane containing the first and second base conductors; a first face terminal extending along any one of the first plurality of stack side faces in contact with the first plate electrodes and being electrically connected to the first base conductor; and a second face terminal electrically spaced from the first face terminal, extending along any one of the first plurality of stack side faces in contact with the plurality of second plate electrodes, and being electrically connected to the second base conductor.

A2. The capacitor assembly of paragraph A1, wherein the one of the plurality of stack side faces along which the first face terminal extends is a first stack side face, the first stack side face extending between second and third stack side faces of the plurality of stack side faces, and the first base conductor is connected to the first face terminal at a portion of the first face terminal that is intermediate between the second and third stack side faces.

A3. The capacitor assembly of paragraph A2, wherein the first base conductor is connected to the first face terminal at the portion of the first face terminal that is located centrally between the second and third stack side faces.

A4. The capacitor assembly of paragraph A1, wherein the first multilayer capacitor of the at least one multilayer capacitor includes a second multilayer capacitor supported electrically in parallel and physically spaced apart in a side-by-side configuration with the first multilayer capacitor, the second multilayer capacitor including physically and electrically spaced-apart coplanar third and fourth base conductors, the third base conductor configured to be electrically connected to the first external conductor and the fourth base conductor configured to be electrically connected to the second external conductor; a second capacitor stack having a plurality of third plate electrodes, a plurality of fourth plate electrodes, and a second dielectric body supporting the third and fourth plate electrodes in spaced apart parallel positions, the second capacitor stack having a second plurality of stack side faces transverse to planes of the third and fourth plate electrodes, the second capacitor stack being supported relative to the third and fourth base conductors with one of the second plurality of stack side faces facing and extending along a plane containing the third and fourth base conductors; a third face terminal extending along any one of the second plurality of stack side faces in contact with the first plate electrodes and being electrically connected to the third base conductor; and a fourth face terminal electrically spaced from the third face terminal, extending along any one of the plurality of stack side faces in contact with the plurality of second plate electrodes, and being electrically connected to the fourth base conductor.

A5. The capacitor assembly of paragraph A4, further comprising a first lossy component extending between the first and third base conductors, the first lossy component being at least one of magnetically lossy and electrically lossy.

A6. The capacitor assembly of paragraph A5, further comprising a second lossy component extending between the second and fourth base conductors, the second lossy component being at least one of magnetically lossy and electrically lossy.

A7. The capacitor assembly of paragraph A6, wherein the first lossy component is directly connected to the first and third base conductors and the second lossy component is directly connected to the second and fourth base conductors.

B1. A capacitor assembly comprising a first multilayer capacitor comprising physically and electrically spaced-apart coplanar first and second base conductors, each of the first and second base conductors configured to be electrically connected to respective different first and second external conductors of an external circuit; a first capacitor stack having a plurality of first plate electrodes, a plurality of second plate electrodes, and a first dielectric body supporting the first and second plate electrodes in spaced apart parallel positions, the first capacitor stack having a first plurality of stack side faces transverse to planes of the first and second plate electrodes; a first face terminal extending along any one of the first plurality of stack side faces in contact with the first plate electrodes and being electrically connected to the first base conductor; and a second face terminal electrically spaced from the first face terminal, extending along any one of the first plurality of stack side faces in contact with the plurality of second plate electrodes, and being electrically connected to the second base conductor; a second multilayer capacitor supported electrically in parallel and physically spaced apart in a side-by-side configuration with the first multilayer capacitor, the second multilayer capacitor including physically and electrically spaced-apart coplanar third and fourth base conductors, the third base conductor configured to be electrically connected to the first external conductor and the fourth base conductor configured to be electrically connected to the second external conductor; a second capacitor stack having a plurality of third plate electrodes, a plurality of fourth plate electrodes, and a second dielectric body supporting the third and fourth plate electrodes in spaced apart alternating parallel positions, the second capacitor stack having a second plurality of stack side faces transverse to planes of the third and fourth plate electrodes; a third face terminal extending along any one of the second plurality of stack side faces in contact with the third plate electrodes and being electrically connected to the third base conductor; and a fourth face terminal electrically spaced from the third face terminal, extending along any one of the plurality of stack side faces in contact with the plurality of fourth plate electrodes, and being electrically connected to the second base conductor; and a first lossy component extending between the first and third base conductors, the first lossy component being at least one of magnetically lossy and electrically lossy.

B2. The capacitor assembly of paragraph B1, further comprising a second lossy component extending between the second and fourth base conductors, the second lossy component being at least one of magnetically lossy and electrically lossy.

B3. The capacitor assembly of paragraph B2, wherein the first lossy component is directly connected to the first and third base conductors and the second lossy component is directly connected to the second and fourth base conductors.

C1. A multilayer capacitor comprising physically and electrically spaced-apart first and second base conductors, each of the first and second base conductors configured to be attached to a respective different external conductor of an external circuit; a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to at least two of the stack side faces, and each of the second plate electrodes extending to at least two of the stack side faces; a first face terminal extending along one of the two stack side faces to which the first plate electrodes extend, the first face terminal being in contact with the first plate electrodes; a second face terminal extending along the other of the two stack side faces to which the first plate electrodes extend, the second face terminal being in contact with the first plate electrodes; a third face terminal extending along one of the two stack side faces to which the second plate electrodes extend, the third face terminal being in contact with the second plate electrodes; and a fourth face terminal extending along the other of the two stack side faces to which the second plate electrodes extend, the second face terminal being in contact with the second plate electrodes; wherein the first and second face terminals are electrically connected to the first base conductor and the third and fourth face terminals are electrically connected to the second base conductor.

C2. The multilayer capacitor of paragraph C1, wherein at least one of the stack side faces to which the first plate electrodes extend to is not one of the stack side faces to which the second plate electrodes extend.

C3. The multilayer capacitor of paragraph C1, wherein the two stack side faces to which the first plate electrodes extend are opposite each other on the capacitor stack.

C4. The multilayer capacitor of paragraph C3, wherein the two stack side faces to which the second plate electrodes extend are also opposite each other on the capacitor stack.

C5. The multilayer capacitor of paragraph C4, wherein at least a portion of the first plate electrodes each include coplanar first and second plate electrode portions separated by a respective first gap, the first plate electrode portions being connected to the first face terminal and the second plate electrode portions being connected to the second face terminal.

C6. The multilayer capacitor of paragraph C5, wherein at least a portion of the second plate electrodes each include coplanar third and fourth plate electrode portions separated by a respective second gap, the third plate electrode portions being connected to the third face terminal and the fourth plate electrode portions being connected to the fourth face terminal.

C7. The multilayer capacitor of paragraph C4, wherein the first, second, third, and fourth face terminals are on different respective ones of the four stack side faces.

C8. The multilayer capacitor of paragraph C3, wherein the first base conductor extends from the first face terminal along one of the stack end faces to the second face terminal.

C9. The multilayer capacitor of paragraph C8, wherein the second base conductor extends between the third and fourth face terminals around and spaced apart from the capacitor stack and the second face terminal.

C10. The multilayer capacitor of paragraph C9, wherein the second base conductor extends along the second face terminal in a plane parallel to the second face terminal.

C11. The multilayer capacitor of paragraph C8, wherein the second base conductor contacts the third and fourth face terminals adjacent the one capacitor-stack end face.

C12. The multilayer capacitor of paragraph C8, wherein the second base conductor contacts the third and fourth face terminals at positions intermediate between the capacitor-stack end faces.

C13. The multilayer capacitor of paragraph C8, wherein the second base conductor contacts the third and fourth face terminals adjacent to the other capacitor-stack end face.

C14. The multilayer capacitor of paragraph C1, wherein at least one of the first plate electrodes has a resistance that is more than twice the value of a resistance of other first plate electrodes.

C15. The multilayer capacitor of paragraph C14, wherein the at least one of the plate electrodes includes at least two of the first plate electrodes having the resistance.

C16. The multilayer capacitor of paragraph C15, wherein the first plate electrodes having the resistance are positioned adjacent each other in the plurality of first plate electrodes.

C17. The multilayer capacitor of paragraph C14, wherein the at least one first plate electrode is positioned adjacent one of the end faces of the capacitor stack.

C18. The multilayer capacitor of paragraph C17, wherein the first base conductor is connected to the first and second face terminals adjacent the other of the end faces of the capacitor stack.

C19. The multilayer capacitor of paragraph C1, wherein the two stack side faces to which the first plate electrodes extend are adjacent each other on the capacitor stack.

C20. The multilayer capacitor of paragraph C19, wherein the two stack side faces to which the second plate electrodes extend are also adjacent each other on the capacitor stack.

C21. The multilayer capacitor of paragraph C20, wherein the first, second, third, and fourth face terminals are on different respective ones of the four stack side faces.

C22. The multilayer capacitor of paragraph C21, wherein the first and second face terminals are connected together along a common edge.

C23. The multilayer capacitor of paragraph C22, wherein the third and fourth face terminals are also connected together along a respective common edge.

C24. The multilayer capacitor of paragraph C23, wherein the first face terminal is connected to the first base conductor and the third face terminal is connected to the second base conductor.

C25. The multilayer capacitor of paragraph C24, wherein the first face terminal is positioned on a stack side face that is opposite the stack side face along which the third face terminal is positioned.

C26. The multilayer capacitor of paragraph C24, wherein the first base conductor contacts the first face terminal adjacent to at least one of the capacitor-stack end faces.

C27. The multilayer capacitor of paragraph C24, wherein the first base conductor contacts the first face terminal at a position intermediate between the capacitor end faces.

C28. The multilayer capacitor of paragraph C27, wherein the first base conductor also contacts the first face terminal adjacent to both of the capacitor-stack end faces.

C29. The multilayer capacitor of paragraph C19, wherein the at least two of the stack side faces to which the first plate electrodes extend include a first stack side face and respective first portions of second and third stack side faces that are adjacent to the first stack side face, the first face terminal extending along the first stack side face, and the second face terminal extending along the first portion of the second stack side face, and the multilayer capacitor further comprising a fifth face terminal extending along the first portion of the third stack side face, the fifth face terminal being electrically connected to the first base conductor.

C30. The multilayer capacitor of paragraph C29, wherein the first and second face terminals are connected together along a first common edge and the first and fifth face terminals are connected together along a second common edge.

C31. The multilayer capacitor of paragraph C29, wherein the first base conductor contacts the first face terminal adjacent to at least one of the capacitor-stack end faces.

C32. The multilayer capacitor of paragraph C29, wherein the first base conductor contacts the first face terminal at a position intermediate between the capacitor end faces.

C33. The multilayer capacitor of paragraph C32, wherein the first base conductor also contacts the first face terminal adjacent to both of the capacitor-stack end faces.

C34. The multilayer capacitor of paragraph C29, wherein the second and fifth face terminals extend along equal lengths of the first plate electrodes.

C35. The multilayer capacitor of paragraph C29, wherein the at least two of the stack side faces to which the second plate electrodes extend include a fourth stack side face opposite the first stack side face and respective second portions of the second and third stack side faces that are adjacent to the fourth stack side face, the third face terminal extending along the fourth stack side face, and the fourth face terminal extending along the second portion of the second stack side face, and the multilayer capacitor further comprising a sixth face terminal extending along the second portion of the third stack side face, the sixth face terminal being electrically connected to the second base conductor.

C36. The multilayer capacitor of paragraph C35, wherein the third and fourth face terminals are connected together along a third common edge and the third and sixth face terminals are connected together along a fourth common edge.

C37. The multilayer capacitor of paragraph C35, wherein there is a first gap along the second stack side face between the second and fourth face terminals and a second gap along the third stack side face between the fifth and sixth face terminals.

C38. The multilayer capacitor of paragraph C35, wherein the second and fourth face terminals extend along unequal lengths of the first plate electrodes.

C39. The multilayer capacitor of paragraph C38, wherein the second and fourth face terminals each extend along less than half of the lengths of the second stack side face between the first and fourth stack side faces.

C40. The multilayer capacitor of paragraph C35, wherein at least a portion of the first plate electrodes are each coplanar with a corresponding one of the second plate electrodes.

C41. The multilayer capacitor of paragraph C40, wherein there is a gap between each pair of coplanar first and second plate electrodes.

C42. The multilayer capacitor of paragraph C41, wherein the capacitor stack further includes an intermediate plate electrode parallel with each pair of coplanar first and second plate electrodes, each intermediate plate electrode extending from a position spaced-apart from and adjacent to the first plate electrode of each pair of coplanar first and second plate electrodes to a position spaced-apart from and adjacent to the second plate electrode of each pair of coplanar first and second plate electrodes.

C43. The multilayer capacitor of paragraph C42, wherein each intermediate plate electrode has a first distal edge extending along the adjacent first plate electrode and a second distal edge opposite the first distal edge and extending along the adjacent second plate electrode, the intermediate plate electrode having a width between the first distal edge and the second distal edge that varies along lengths of the first and second distal edges.

C44. The multilayer capacitor of paragraph C43, wherein the width of the intermediate plate electrode is longer in end portions of the first and second distal edges than in an intermediate portion of the first and second distal edges between the end portions.

The different embodiments of the multilayer capacitors described herein provide several advantages over known solutions for providing capacitance to high frequency circuits. For example, the illustrative embodiments of multilayer capacitors described herein provide reduced series resistance, improving circuit performance and reducing circuit losses. Not all embodiments described herein provide the same advantages or the same degree of advantage.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Where "a" or "a first" element or the equivalent thereof is recited, such usage includes one or more such elements, neither requiring nor excluding two or more such elements. Further, ordinal indicators, such as first, second, or third, for identified elements are used to distinguish between the elements in the order in which they are introduced, and do not indicate a required or limited number of such elements, and do not indicate a particular position or order of such elements unless otherwise specifically indicated. Accordingly, the ordinal indicator used for a particular element may vary in different contexts.

The invention claimed is:

1. A multilayer capacitor comprising:
physically and electrically spaced-apart first and second base conductors, each of the first and second base conductors configured to be attached to a respective different external conductor of an external circuit;
a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to at least the two stack side faces of one of the two pairs of oppositely positioned stack side faces, and each of the second plate electrodes extending to at least the two stack side faces of the other of the two pairs of oppositely positioned stack side faces;

a first face terminal extending along one of the two stack side faces to which the first plate electrodes extend, the first face terminal being in contact with the first plate electrodes;

a second face terminal extending along the other of the two stack side faces to which the first plate electrodes extend, the second face terminal being in contact with the first plate electrodes;

a third face terminal extending along one of the two stack side faces to which the second plate electrodes extend, the third face terminal being in contact with the second plate electrodes; and a fourth face terminal extending along the other of the two stack side faces to which the second plate electrodes extend, the fourth face terminal being in contact with the second plate electrodes;

wherein the first and second face terminals are electrically and directly physically connected to the first base conductor and the third and fourth face terminals are electrically and directly physically connected to the second base conductor.

2. The multilayer capacitor of claim 1, wherein the first plate electrodes each consists only of coplanar first and second plate electrode portions separated by a respective first gap, the first plate electrode portions being directly physically connected to the first face terminal and the second plate electrode portions being directly physically connected to the second face terminal.

3. The multilayer capacitor of claim 2, wherein the second plate electrodes each consists only of coplanar third and fourth plate electrode portions separated by a respective second gap, the third plate electrode portions being directly physically connected to the third face terminal and the fourth plate electrode portions being directly physically connected to the fourth face terminal.

4. The multilayer capacitor of claim 1, wherein the first base conductor extends from the first face terminal along one of the stack end faces to the second face terminal.

5. The multilayer capacitor of claim 4, wherein the second base conductor extends between the third and fourth face terminals around and spaced apart from the capacitor stack and the second face terminal.

6. The multilayer capacitor of claim 5, wherein the second base conductor extends along the second face terminal in a plane parallel to the second face terminal.

7. The multilayer capacitor of claim 4, wherein the second base conductor contacts and extends transversely from the third and fourth face terminals adjacent the one capacitor-stack end face.

8. The multilayer capacitor of claim 4, wherein the second base conductor contacts and extends transversely from the third and fourth face terminals at positions intermediate between the capacitor-stack end faces.

9. The multilayer capacitor of claim 4, wherein the second base conductor contacts and extends transversely from the third and fourth face terminals adjacent to the other capacitor-stack end face.

10. A multilayer capacitor comprising:

physically and electrically spaced-apart first and second base conductors, each of the first and second base conductors configured to be attached to a respective different external conductor of an external circuit;

a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to at least one of the stack side faces, and each of the second plate electrodes extending to at least one of the stack side faces;

a first face terminal extending along the at least one of the stack side faces to which the first plate electrodes extend, the first face terminal being in contact with the first plate electrodes; and a second face terminal extending along the at least one of the stack side faces to which the second plate electrodes extend, the second face terminal being in contact with the second plate electrodes;

wherein the first face terminal is electrically connected to the first base conductor and the second face terminal is electrically connected to the second base conductor;

and at least one of the first plate electrodes has a resistance that is more than twice the value of a resistance of other first plate electrodes.

11. The multilayer capacitor of claim 10, wherein the at least one of the plate electrodes includes at least two of the first plate electrodes having the resistance.

12. The multilayer capacitor of claim 11, wherein the first plate electrodes having the resistance are positioned adjacent each other in the plurality of first plate electrodes.

13. The multilayer capacitor of claim 10, wherein the at least one first plate electrode is positioned adjacent one of the end faces of the capacitor stack.

14. The multilayer capacitor of claim 13, wherein the first base conductor is connected to the first face terminal adjacent the other of the end faces of the capacitor stack.

15. A multilayer capacitor comprising:

physically and electrically spaced-apart first and second base conductors, each of the first and second base conductors configured to be attached to a respective different external conductor of an external circuit;

a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to a first stack side face and respective first portions of second and third stack side faces that are adjacent to the first stack side face, and each of the second plate electrodes extending to at least two of the stack side faces;

a first face terminal extending along the first stack side face, the first face terminal being in contact with the first plate electrodes;

a second face terminal extending along the first portion of the second stack side face, the second face terminal being in contact with the first plate electrodes;

a third face terminal extending along one of the two stack side faces to which the second plate electrodes extend, the third face terminal being in contact with the second plate electrodes;

a fourth face terminal extending along the other of the two stack side faces to which the second plate electrodes extend, the fourth face terminal being in contact with the second plate electrodes; and a fifth face terminal extending along the first portion of the third stack side face, the fifth face terminal being in contact with the first plate electrodes;

wherein the first, second, and fifth face terminals are electrically connected to the first base conductor, the third and fourth face terminals are electrically connected to the second base conductor, and the first base conductor contacts and extends transversely from the first face terminal at a position intermediate between the capacitor end faces.

16. The multilayer capacitor of claim 15, wherein the first base conductor also contacts and extends transversely from the first face terminal adjacent to both of the capacitor-stack end faces.

17. A multilayer capacitor comprising:

physically and electrically spaced-apart first and second base conductors, each of the first and second base conductors configured to be attached to a respective different external conductor of an external circuit;

a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to a first stack side face and respective first portions of second and third stack side faces that are adjacent to the first stack side face, and each of the second plate electrodes extending to a fourth side face opposite the first stack side face and respective second portions of the second and third stack faces that are adjacent to the fourth stack side face;

a first face terminal extending along the first stack side face, the first face terminal being in contact with the first plate electrodes;

a second face terminal extending along the first portion of the second stack side face, the second face terminal being in contact with the first plate electrodes;

a third face terminal extending along the fourth stack side face, the third face terminal being in contact with the second plate electrodes;

a fourth face terminal extending along the second portion of second stack side face, the fourth face terminal being in contact with the second plate electrodes;

a fifth face terminal extending along the first portion of the third stack side face, the fifth face terminal being in contact with the first plate electrodes; and a sixth face terminal extending along the second portion of the third stack side face, the sixth face terminal being electrically connected to the second base conductor wherein the first, second, and fifth face terminals are electrically connected to the first base conductor; the third, fourth, and sixth face terminals are electrically connected to the second base conductor; and the second and fourth face terminals each extend along less than half of a length of the second stack side face between the first and fourth stack side faces and along unequal lengths of the second stack face between the first and fourth stack side faces.

18. A multilayer capacitor comprising:

physically and electrically spaced-apart first and second base conductors, each of the first and second base conductors configured to be attached to a respective different external conductor of an external circuit;

a capacitor stack having a plurality of first plate electrodes, a plurality of second plate electrodes, and a dielectric body supporting the first and second plate electrodes in spaced-apart positions, the capacitor stack having two stack end faces and four stack side faces including two pairs of oppositely positioned stack side faces, the two stack end faces extending between respective edges of the four stack side faces, the first and second plate electrodes of the respective pluralities of first and second plate electrodes extending in planes transverse to the four stack side faces, each of the first plate electrodes extending to a first stack side face and respective first portions of second and third stack side faces that are adjacent to the first stack side face, and each of the second plate electrodes extending to a fourth side face opposite the first stack side face and respective second portions of the second and third stack faces that are adjacent to the fourth stack side face;

a first face terminal extending along the first stack side face, the first face terminal being in contact with the first plate electrodes;

a second face terminal extending along the first portion of the second stack side face, the second face terminal being in contact with the first plate electrodes;

a third face terminal extending along the fourth stack side face, the third face terminal being in contact with the second plate electrodes;

a fourth face terminal extending along the second portion of second stack side face, the fourth face terminal being in contact with the second plate electrodes;

a fifth face terminal extending along the first portion of the third stack side face, the fifth face terminal being in contact with the first plate electrodes; and a sixth face terminal extending along the second portion of the third stack side face, the sixth face terminal being electrically connected to the second plate electrodes;

wherein the first, second, and fifth face terminals are electrically connected to the first base conductor; the third, fourth, and sixth face terminals are electrically connected to the second base conductor; at least a portion of the first plate electrodes are each coplanar with a corresponding one of the second plate electrodes; there is a gap between each pair of coplanar first and second plate electrodes; the capacitor stack further includes an intermediate plate electrode parallel with each pair of coplanar first and second plate electrodes, each intermediate plate electrode extending from a position spaced-apart from and adjacent to the first plate electrode of each pair of coplanar first and second plate electrodes to a position spaced-apart from and adjacent to the second plate electrode of each pair of coplanar first and second plate electrodes; and each intermediate plate electrode has a first distal edge extending along the adjacent first plate electrode and a second distal edge opposite the first distal edge and extending along the adjacent second plate electrode, the intermediate plate electrode having a width between the first distal edge and the second distal edge that varies along lengths of the first and second distal edges.

19. The multilayer capacitor of claim 18, wherein the width of the intermediate plate electrode is longer in end portions of the first and second distal edges than in an intermediate portion of the first and second distal edges between the end portions.

* * * * *